US006844137B2

(12) United States Patent
Fujimaki et al.

(10) Patent No.: US 6,844,137 B2
(45) Date of Patent: Jan. 18, 2005

(54) IMAGE RECORDING MATERIAL

(75) Inventors: Kazuhiro Fujimaki, Shizuoka-ken (JP); Tadahiro Sorori, Shizuoka-ken (JP)

(73) Assignee: Fuji Photo Film Co., Ltd., Minami-Ashigara (JP)

( * ) Notice: Subject to any disclaimer, the term of this patent is extended or adjusted under 35 U.S.C. 154(b) by 94 days.

(21) Appl. No.: 09/795,195

(22) Filed: Mar. 1, 2001

(65) Prior Publication Data

US 2002/0086238 A1 Jul. 4, 2002

(30) Foreign Application Priority Data

Mar. 1, 2000 (JP) ....................................... 2000-055564
May 2, 2000 (JP) ....................................... 2000-133198

(51) Int. Cl.[7] .......................... G03F 7/027; G03F 7/029

(52) U.S. Cl. ............................... 430/281.1; 430/284.1; 430/286.1; 430/302; 430/944; 430/945; 430/964

(58) Field of Search ........................... 430/270.1, 281.1, 430/284.1, 286.1, 287.1, 288.1, 302, 348, 944, 945, 964

(56) References Cited

U.S. PATENT DOCUMENTS

| | | | | | |
|---|---|---|---|---|---|
| 4,214,965 | A | * | 7/1980 | Rowe | 204/159.15 |
| 5,340,699 | A | | 8/1994 | Haley et al. | |
| 6,017,677 | A | * | 1/2000 | Maemoto et al. | 430/270.1 |
| 6,040,115 | A | * | 3/2000 | Bailey et al. | 430/303 |
| 6,117,613 | A | * | 9/2000 | Kawauchi et al. | 430/270.1 |
| 6,132,929 | A | * | 10/2000 | Nakamura et al. | 430/270.1 |
| 6,143,464 | A | * | 11/2000 | Kawauchi | 430/270.1 |
| 6,153,352 | A | * | 11/2000 | Oohashi et al. | 430/270.1 |
| 6,153,356 | A | * | 11/2000 | Urano et al. | 430/281.1 |
| 6,238,839 | B1 | * | 5/2001 | Tomita et al. | 430/278.1 |
| 6,346,365 | B1 | * | 2/2002 | Kawauchi et al. | 430/302 |
| 6,423,467 | B1 | * | 7/2002 | Kawauchi et al. | 430/270.1 |
| 6,440,633 | B1 | * | 8/2002 | Kawauchi | 430/270.1 |
| 2001/0036598 | A1 | * | 11/2001 | Shimada et al. | 430/281.1 |
| 2002/0025489 | A1 | * | 2/2002 | Shimada et al. | 430/270.1 |
| 2002/0136987 | A1 | * | 9/2002 | Oshima | 430/281.1 |
| 2002/0142244 | A1 | * | 10/2002 | Takashima et al. | 430/138 |

FOREIGN PATENT DOCUMENTS

| | | |
|---|---|---|
| EP | 0 867 769 A1 | 9/1998 |
| EP | 0 919 868 A1 | 6/1999 |
| EP | 0 949 540 A1 | 10/1999 |
| JP | 4-204453 A | 7/1992 |
| JP | 7-103171 | 11/1995 |
| JP | 8-108621 | 4/1996 |
| JP | 9-034110 | 2/1997 |

* cited by examiner

*Primary Examiner*—Barbara L. Gilliam
(74) *Attorney, Agent, or Firm*—Burns, Doane, Swecker & Mathis, L.L.P.

(57) ABSTRACT

A heat mode corresponding negative-type image recording material by which ablation in laser scanning when recording is suppressed, the intensity of the formed image portion can be high and a planographic plate excellent in plate life can be formed is provided. It is characterized in that it contains (A) polyurethane resin insoluble in water and soluble in an aqueous alkaline solution or a polymeric compound which has on the side chain thereof a group represented by the general formula (39) or the general formula (40) as a polymeric compound insoluble in water and soluble in an aqueous alkaline solution, (B) a radical-polymerizable compound, (C) a light-to-heat converting agent and (D) a compound generating a radical by heat mode exposure of a light of wavelength which can be absorbed by (C) a light-to-heat converting agent and image recording can be carried out by the heat mode exposure.

$$X—NH—Y— \quad (39)$$

$$-Z-NH—R \quad (40)$$

15 Claims, No Drawings

IMAGE RECORDING MATERIAL

BACKGROUND OF THE INVENTION

1. Field of the Invention

The present invention relates to a negative-type image recording material on which an infrared laser is capable of writing, and particularly relates to a negative-type image recording material whose strength of an image portion of a recording layer is high, and which is capable of forming a planographic plate having excellent plate life.

2. Description of the Related Art

As the development of laser technologies has been significant in recent years, particularly, in a solid state laser and a semiconductor laser having a light emission region from near infrared rays region to infrared rays region, the trends of higher powering and miniaturization of laser devices have been proceeded. Therefore, these lasers are very much useful as a light source for exposure when a plate is engraved directly from digital data of a computer or the like.

A material for a negative-type planographic plate for infrared-laser for which an infrared laser having a light emission region in the aforementioned infrared rays region is used as a light source for exposure is a material for a planographic plate, which has a photosensitive layer containing an infrared absorbing agent, a polymerization initiator for generating a radical due to the light or heat and a polymerizable compound.

Usually, such a negative-type image recording material utilizes a recording method in which a polymerization reaction is generated using a radical as an initiator generated due to the light or heat and an image portion is formed by hardening a recording layer of an exposure portion. As for such a negative-type image formation material, the image formation property is lower compared to that of a positive-type image formation material causing the solubilization of a recording layer by an energy of infrared laser irradiation and the negative-type image formation material forms a tight image portion by promoting hardening reaction by polymerization, it is common to carry out a heating process prior to a development process.

As such a printing plate having a recording layer formed by polymerization system due to the light or heat, technologies employing photopolymeric or thermal polymeric compositions as a photosensitive layer as mentioned in respective publications of Japanese Patent Application Laid-Open No. 8-108621 and JP-A No. 9-34110 are known. Although these photosensitive layers are excellent in high sensitivity image formation property, in the case where a hydrophilization-processed substrate has been used as a substrate, there are problems that adhesion in an interface between the photosensitive layer and the substrate is low and the plate life is inferior.

Moreover, in order to enhance the sensitivity, it has been also considered to use a high power infrared laser, however, there has been also a problem that the ablation of a photosensitive layer has been generated during laser scanning and the optical system has been polluted.

SUMMARY OF THE INVENTION

The present invention has been carried out in consideration of the above-described problems, an object of the present invention is to provide a negative-type image recording material whose ablation in laser scanning during recording is suppressed, the strength of the formed image portion is high and which is capable of forming a planographic plate having excellent plate life.

The present inventors have found that recording excellent in the strength of an image portion is performed by employing polyurethane resin or a polymeric compound which has on the side chain thereof a group represented by the general formula (39) or the general formula (40) as a polymeric compound insoluble in water and soluble in an aqueous alkaline solution and has completed the present invention as the result of making every effort to investigate.

Specifically, A heat mode corresponding negative-type image recording material of the present invention contains (A) a polyurethane resin insoluble in water and soluble in an aqueous alkaline solution, (B) a radical-polymerizable compound, (C) a light-t-heat converting agent and (D) a compound which is capable of image-recording by heat mode exposure to light of a wavelength which can be absorbed by (C) the light-to-heat converting agent, wherein image recording can be carried out by heat mode exposure.

A heat mode corresponding negative-type image recording material of the present invention contains (A) a polymeric compound having a group represented by the following general formula (39) or a group represented by the following general formula (40) on a side chain and being insoluble in water and soluble in an aqueous alkaline solution, (B) a radical-polymerizable compound, (C) a light-to-heat converting agent, and (D) a compound which is capable of image-recording by a heat mode exposure of a light of wavelength which can be absorbed by (C) a light-to-heat converting agent, wherein an image recording can be performed by a heat mode exposure:

X—NH—Y— (39)

Z-NH—R— (40)

wherein X and Y represent bivalent organic groups, at least one of them represents —CO—, —$SO_2$—; Z represents —CO—, —$SO_2$—; and R represents a hydrogen atom or univalent organic group.

It should be noted that as used herein, the term "heat mode correspondence" means that the recording can be performed by the heat mode exposure. The definition of the heat mode exposure used in the present invention will be described below in detail. As mentioned in Hans-Joachim Timpe: International Conference on Digital Printing Technologies., IS & Ts NIP 15: P. 209, 1999, it is known that two major modes roughly classified exist in the processes constituted from the process of the optical excitation of the light absorbing material to the process of chemically or physically changing, which are specifically the processes from the process of causing a light absorbing material (e.g., dye) in photosensitive material to be optically excited via the process of chemically or physically changing to the process of forming an image. One of them is, what is called, a photon mode in which the light absorbing agent optically excited is deactivated with any photochemical interaction (e.g., energy transfer or electron transfer) occurred by the relevant light absorbing agent reacted with the other reactants in the photosensitive material, as a result, the activated reactant material causes chemical or physical change necessary for the above-described image formation. Then, the other of them is, what is called, a heat mode in which the light absorbing agent optically excited generates heat and is deactivated, reactant causes chemical or physical change necessary for the above-described image formation. Although there are other special modes such as the ablation mode in which the substance is explosively scattered with the energy of light locally converged and the multiple photon absorption mode in which one molecule absorbs a large number of photons at one time, the description about these is omitted herein.

The exposure process utilizing the above-described respective modes is referred to as the photon mode exposure and the heat mode exposure. The technical difference between the photon mode exposure and the heat mode exposure lies in whether or not an amount of energy of a few photons can be added to an amount of energy for reaction to be aimed at and the total amount can be utilized. For example, suppose that a certain reaction is generated by employing n photons. As to the photon mode exposure, since it utilizes photochemical interaction, the total amount of energy to which an amount of energy of one photon is added cannot be used according to the requirement of the preservation law of quantum energy and momentum. Specifically, in order to generate any reaction, it is required that the relationship of "an amount of energy of one photon≧an amount of energy of reaction" holds. On the other hand, as to the heat mode exposure, since it generates heat after the light excitation and converts light energy into heat and utilizes it, the addition of an amount of energy can be realized. Therefore, it is sufficient if the relationship of "an amount of energy of n photons≧an amount of energy of reaction" holds. Provided that the addition of the amount of energy is limited by thermal diffusion. Specifically, if the next light excitation-deactivation process is generated by the time of the heat escaping from exposure portion (reaction site) of interest by thermal diffusion to generate heat, the heat is securely accumulated and added, and leads to the rise of the temperature at that portion. However, in the case where the next heat generation is delayed, the heat escapes and is not accumulated. Namely, as to the heat mode exposure, even if the total exposure energy amounts are identical, the results are different between in the case where a light with higher energy amount is irradiated in a shorter time period and in the case where a light with lower energy amount is irradiated in a longer time period, the case of irradiation in a shorter time period is advantageous for the thermal accumulation.

Needless to say, in the photon mode exposure, although there may be some cases where a similar phenomenon is occurred by the influence of the diffusion of the following reaction species in the photon mode exposure, such an event is not basically happened.

Specifically, if considering from the viewpoint of a characteristic of a photosensitive material, in the photon mode, the inherent sensitivity of a photosensitive material (an amount of energy necessary for the reaction for the formation of an image) with respect to the exposure power density ($W/cm^2$) (an energy density per unit hours) is constant, however, in the heat mode, the inherent sensitivity of a photosensitive material will rise with respect to the exposure power density. Therefore, if the exposure time period in a degree of capable of maintaining the productivity necessary for an actual image recording material in a practical use is fixed and comparing in each mode, in the photon mode exposure, usually high sensitivity on the order of about 0.1 $mJ/cm^2$ can be achieved, however, since reaction is occurred even if there exists any little amount of exposure, the problem of lower exposure fog in an exposure portion is easily occurred. Comparing to this, in the heat mode exposure, although reaction is not occurred unless there exists more than a predetermined amount of exposure and, usually, it requires on the order of 50 $mJ/cm^2$ from the relationship to thermal stability of a photosensitive material, the problem of lower exposure fog can be avoided.

Then, actually in the heat mode exposure, it requires 5,000 $cm^2$ or more of the exposure power density on the plate surface of a photosensitive material, preferably it requires 10,000 $W/cm^2$ or more. But, not described in detail herein, ablation is occurred if a high power laser of $5.0\times 10^5/cm^2$ or more is utilized and it is not preferable because the problems such as the pollution of the light source and the like may be occurred.

Although the action of the present invention is not clear, in an aspect of the image recording material of the present invention, since coating having high strength is formed due to hydrogen bonding of the principal chain of urethane group by using (A) specific polyurethane resin as polymeric compound which is soluble in an aqueous alkaline solution, in the case where this image recording material is used for a photosensitive layer of the heat mode corresponding planographic original plate, it is considered that ablation is suppressed during infrared laser scanning exposure and the pollution of the optical system such as the damage of the negative image portion and spinner mirror of scanning exposure device is suppressed.

Moreover, since polyurethane resin is excellent in coating-forming property, a dissolved oxygen amount after the film formation is low in the film, and further since oxygen blocking from the external is high, the polymerization inhibition due to oxygen of a radical-polymerizable compound is suppressed. Owing to this, coating is formed in a high hardening degree due to the polymerization, in the case where it is used for a photosensitive layer of the planographic original plate, since the formed image portion is sufficiently hardened, the printing plate having high plate life can be formed.

Furthermore, since a polyurethane resin used in the present invention has an urethane group which is a polar group as a principal chain, for example, is excellent in affinity to a high polar medium such as water and the like. Therefore, usually, comparing to an acryl resin which is soluble in an aqueous alkaline solution and the like used for an image recording material, the polyurethane resin is excellent in water dispersion, in the case where it is used for the planographic original plate, it also has an advantage that a foreign matter occurred at the time of development which will be a problem on running suitability is not easily generated.

In another aspect of the image recording material of the present invention, the polymeric compound functioning as the binder is a polymeric compound which contains at least one group represented by the general formula (39) or the general formula (40). Presumably because such a functional group has in the structure thereof an acidic hydrogen atom and a film having a high level of strength is formed by hydrogen bonding, the strength of image portions is high. Further, presumably because the hydrogen bonding causes the binder polymers to combine together strongly so that the penetration of the developing solution is inhibited in the developing step using an alkaline developing solution, the decrease of the image strength due to the swelling of the image portions by the penetration of the developing solution can be effectively prevented.

Still further, presumably because the presence of such a group improves the compatibility of the binder polymer with other components such as a polymeric compound constituting the image recording material, a problem such as phase separation of components with lapse of time does not occur and excellent storage stability can be obtained. Because of these effects, when the image recording material of the present invention is used, for example, as the photosensitive layer of a heat-sensitive planographic original plate, a printing plate particularly excellent in plate life and storage stability can be obtained.

DESCRIPTION OF THE PREFERRED EMBODIMENT

Hereinafter, the present invention will be described in detail.

A heat mode corresponding negative-type image recording material of the present invention is characterized in that it contains (A) a polyurethane resin which is insoluble in water and soluble in an aqueous alkaline solution or a polymeric compound which has on the side chain thereof a group represented by the general formula (39) or the general formula (40) which is insoluble in water and soluble in an aqueous alkaline solution, (B) a radical-polymerizable compound, (C) a light-to-heat converting agent, and (D) a compound for generating a radical by heat-mode exposure to light of a wavelength which is capable of being absorbed by the relevant (C) light-to-heat converting agent. Hereinafter, each compound capable of being used for an image recording material of the present invention will be in turn described.

[(A-1) A Polyurethane Resin which is Insoluble in Water and Soluble in an Aqueous Alkaline Solution (Hereinafter, Appropriately Referred to as Specific Polyurethane Resin)

A specific polyurethane resin used as an essential component for an aspect of the heat mode corresponding negative-type image recording material of the present invention. The specific polyurethane is a polyurethane resin defining a structural unit as a fundamental skeleton, which is represented by reaction product generated between at least one species of diisocyanate compounds represented by the following general formula (2) and at least one species of diol compounds represented by the following general formula (3).

$$OCN—X^{\circ}—NCO \quad (2)$$

$$HO—Y^{\circ}—OH \quad (3)$$

In the formula, X° and Y° represent bivalent organic residues, respectively.

Diisocyanate compound represented by the following general formula (4) is preferable among the above-described isocyanate compounds.

$$OCN\text{-}L^1\text{-}NCO \quad (4)$$

In the above-mentioned formula, $L^1$ represents bivalent aliphatic or aromatic hydrocarbon group which may have a substituent. It will be also good that $L^1$ contains other functional groups which do not react with an isocyanate group, for example, ester, urethane, amide and ureido groups.

(i) Diisocyanate Compounds

As diisocyanate compounds represented by the above-described general formula (4), specifically, the followings are included:

Namely, aromatic diisocyanate compounds such as 2,4-tolylenediisocyanate, dimer of 2,4-tolylenediisocyanate, 2,6-tolylenediisocyanate, p-xylylenediisocyanate, m-xylylenediisocyanate, 4,4'-diphenylmethanediisocyanate, 1,5-naphthylenediisocyanate, 3,3'-dimethylbiphenyl-4,4'-diisocyanate and the like;

Aliphatic diisocyanate compounds such as hexamethylenediisocyanate, trimethyl hexamethylenediisocyanate, lysinediisocyanate, dimer acid diisocyanate and the like;

Alicyclic diisocyanate compounds such as isophoronediisocyanate, 4-4'methylene bis (cyclohexylisocyanate), methylcyclohexan-2,4(or 2,6) diisocyanate, 1,3-(isocyanatomethyl)cyclohexan and the like;

Diisocyanate compounds which are reactants between diol and diisocyanate such as 1 mole of 1,3-butyleneglycol and 2 moles of tolylenediisocyanate and the like are listed.

(ii) Diol Compounds

As diol compounds, widely, polyether diol compounds, polyester diol compounds, polycarbonate diol compounds and the like are listed.

As polyester diol compounds, compounds represented by the following formula (5), (6), (7), (8) and (9), and random copolymer of ethylene oxide having a hydroxyl group in the terminal and propylene oxide having a hydroxyl group in the terminal are listed.

(5)

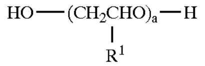

(6)

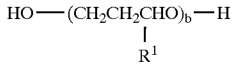

(7)

$$HO—(CH_2CH_2CH_2CH_2O)_c—H$$

(8)

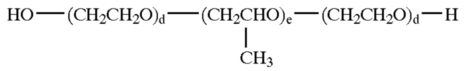

(9)

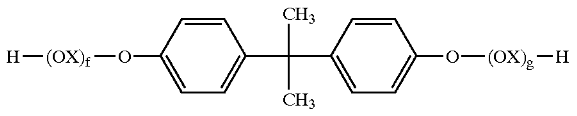

In the above formula, $R^1$ represents hydrogen atom or methyl group, X represents the following groups:

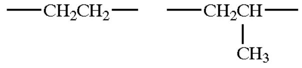

Moreover, each of a, b, c, d, e, f and g represents an integer of 2 or more, and preferably an integer of 2–100.

As polyester diol compounds represented by the formula (5) and (6), specifically, the followings are listed:

Namely, diethylene glycol, triethylene glycol, tetraethylene glycol, pentaethylene glycol, hexaethylene glycol, heptaethylene glycol, octaethylene glycol, di-1,2-propylene glycol, tri-1,2-propylene glycol, tetra-1,2-propylene glycol, hexa-1,2-propylene glycol, di-1,3-propylene glycol, tri-1,3-propylene glycol, tetra-1,3-propylene glycol, di-1,3-butylene glycol, tri-1,3-butylene glycol, hexa-1,3-butylene glycol, polyethylene glycol of weight-average molecular weight 1,000, polyethylene glycol of weight-average molecular weight 1,500, polyethylene glycol of weight-average molecular weight 2,000, polyethylene glycol of weight-average molecular weight 3,000, polyethylene glycol of weight-average molecular weight 7,500, polypropylene glycol of weight-average molecular weight 400, polypropylene glycol of weight-average molecular weight 700, polypropylene glycol of weight-average molecular weight 1,000, polypropylene glycol of weight-average molecular weight 2,000, polypropylene glycol of weight-average molecular weight 3,000, polypropylene glycol of weight-average molecular weight 4000 and the like.

As polyether diol compounds represented by the formula (7), specifically, the followings indicated below are listed:

PTMG 650, PTMG 1000, PTMG 2000, PTMG 3000 (products made by Sanyo Chemical Industry, Co., Ltd), and the like.

As polyether diol compounds represented by the formula (8), specifically the followings indicated below are listed:

New pole PE-61, New pole PE-62, New pole PE-64, New pole PE-68, New pole PE-71, New pole PE-74, New pole PE-75, New pole PE-78, New pole PE-108, New pole PE-128, New pole PE-61(products made by Sanyo Chemical Industry, Co., Ltd.) and the like.

As polyether diol compounds represented by the formula (9), specifically, the followings indicated below are listed:

New pole BPE-20, New pole BPE-20F, New pole BPE-20NK, New pole BPE-20T, New pole BPE-20G, New pole BPE-40, New pole BPE-60, New pole BPE-100, New pole BPE-180, New pole BPE-2P, New pole BPE-23P, New pole BPE-3P and New pole BPE-5P (products made by Sanyo Chemical Industry, Co., Ltd.) and the like.

As random copolymer of ethylene oxide and propylene oxide, specifically, the followings indicated below are listed:

New pole 50HB-100, New pole 50HB-260, New pole 50HB-400, New pole 50HB-660, New pole 50HB-2000 and New pole 50HB-5100 (products made by Sanyo Chemical Industry, Co., Ltd.) and the like.

As polyester diol compounds, compounds represented by the formula (10) and the formula (11) are listed:

$$HO—L^2—(O—C(=O)—L^3—C(=O)—O—L^2)_{n1}—OH \quad (10)$$

$$HO—L^4—(O—C(=O)—L^5)_{n2}—OH \quad (11)$$

In the above formula, $L^2$, $L^3$ and $L^4$ represent bivalent aliphatic or aromatic hydrocarbon groups which are available if they are identical or different with each other, respectively, and $L^5$ represents a bivalent aliphatic hydrocarbon group. Preferably, $L^2$, $L^3$ and $L^4$ represent an alkylene group, an alkenylene group, an alkynylene group, an arylene group, and L5 represents an alkylene group. Moreover, in $L^2$, $L^3$, $L^4$ and $L^5$, the other functional groups which do not react with an isocyanate group, for example, ether, carbonyl, ester, cyano, olefin, urethane, amide, ureido group or halogen atom and the like may exist. n1, n2 represent integers of 2 or more, respectively and preferably represent integers of 2–100.

As polycarbonate diol compounds, there are compounds represented by the formula (12).

$$HO—L^6—(O—C(=O)—L^6)_{n3}—OH \quad (12)$$

In the above formula, $L^6$s represent bivalent aliphatic or aromatic hydrocarbon groups which are available if they may be the same or different, respectively. Preferably, $L^6$ represents an alkylene group, an alkenylene group, an alkynylene group, an arylene group. Moreover, in $L^6$, the other functional groups which do not react with an isocyanate group, for example, ether, carbonyl, ester, cyano, olefin, urethane, amide, ureido group or halogen atom and the like may exist. n3 represents an integer of 2 or more, and preferably represents an integer of 2–100.

As diol compounds represented by the formula (10), the formula (11) or the formula (12), specifically, the followings indicated below (exemplified compound No. 1)-(exemplified compounds No. 18) are included. In the specific examples, n represents an integer of 2 or more.

(No. 1)

$$HO—CH_2CH_2—(OC(=O)CH_2CH_2—C(=O)OCH_2CH_2)_n—OH$$

(No. 2)

$$HO—CH_2CH_2—(OC(=O)(CH_2)_4—C(=O)OCH_2CH_2)_n—OH$$

(No. 3)

$$HO—(CH_2)_4—(OC(=O)(CH_2)_4—C(=O)O(CH_2)_4)_n—OH$$

(No. 4)

$$HO—CH_2—C(CH_3)_2—CH_2—(OC(=O)(CH_2)_4—C(=O)OCH_2—C(CH_3)_2—CH_2)_n—OH$$

(No. 5)

$$HO—CH_2CH_2OCH_2CH_2—(OC(=O)(CH_2)_4—C(=O)OCH_2CH_2OCH_2CH_2)_n—OH$$

(No. 6)

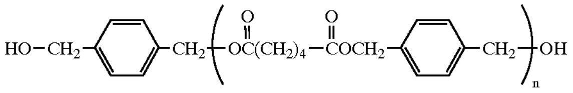

(No. 7)

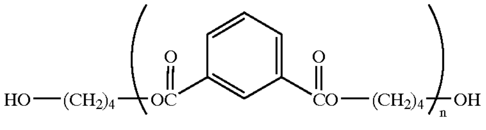

(No. 8)

$$HO—CH_2CH_2—(OC(=O)(CH_2)_5)_n—OH$$

(No. 9)

$$HO—(CH_2)_6—(OC(=O)O(CH_2)_6)_n—OH$$

(No. 10)

$$HO—(CH_2)_5—(OC(=O)O(CH_2)_5)_n—OH$$

(No. 11)

$$HO—(CH_2)_4—(OC(=O)O(CH_2)_4)_n—OH$$

(No. 12)

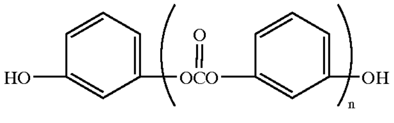

(No. 13)

$$HO—CH_2CH{=}CHCH_2—[OC(=O)(CH_2)_4C(=O)O—CH_2CH{=}CHCH_2O]_n—H$$

(No. 14)

$$HO—CH_2CH_2—[OC(=O)CH{=}CHC(=O)O—CH_2CH_2O]_n—H$$

-continued (No. 15)

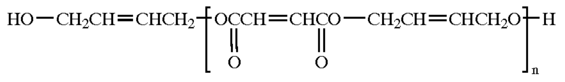

(No. 16)

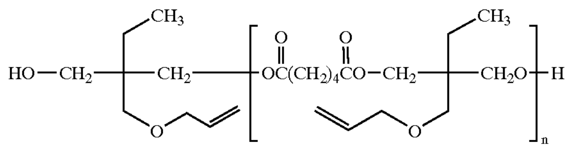

(No. 17)

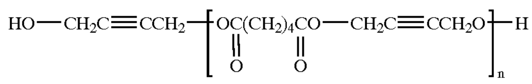

(No. 18)

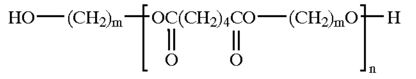

m = 2, 4

A specific polyurethane resin (urethane binder) used for the case where an image recording material of the present invention is employed as a photopolymeric photosensitive layer of the planographic original plate is more preferably a polyurethane resin further having a carboxyl group. As a specific polyurethane resin which is preferably used, polyurethane resins having a structural unit represented by at least one species of diol compounds of the formula (13), the formula (14) and the formula (15) and/or a structural unit derived from the compound in which tetracarbonic acid-2-anhydride is ring-opened in a diol compound, are listed.

(13)

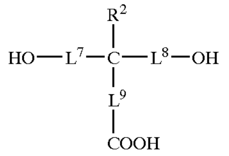

(14)

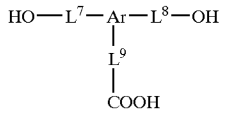

(15)

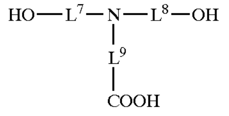

In the aforementioned formula, $R^2$ represents a hydrogen atom, an alkyl group, an aralkyl group, an aryl group, an alkoxy group and an aryloxy group which may have a substituent (e.g., respective groups such as a cyano group, a nitro group, a halogen atoms such as —F, —Cl, —Br, —I and the like, $—CONH_2$, $—COOR^3$, $—OR^3$, $—NHCONHR^3$, $—NHCOOR^3$, $—NHCOR^3$, $—OCONHR^3$ (wherein, $R^3$ represents an alkyl group having 1–10 carbon atoms and an aralkyl group having 7–15 carbon atoms) are included), preferably represents a hydrogen atom, an alkyl group having 1–8 carbon atoms and an aryl group having 6–15 carbon atoms. $L^7$, $L^8$ and $L^9$ may be the same or different and represent a single bond and a bivalent aliphatic or aromatic hydrocarbon group which may have a substituent (e.g., preferably, the respective groups of alkyl, aralkyl, aryl, alkoxy and halogeno groups), preferably represents an alkylene group having piece of 1–20 carbon atoms, an arylene group having 6–15 carbon atoms, and more preferably represents an alkylene group having 1–8 carbon atoms. Moreover, $L^7$, $L^8$ and $L^9$ may have the other functional groups which do not react with an isocyanate group, for example, carbonyl, ester, urethane, amide, ureido and ether groups according to the necessity. It should be noted that a ring may be formed by two pieces or three pieces out of $R^2$, $L^7$, $L^8$ and $L^9$.

Ar represents a trivalent aromatic hydrocarbon group which may have a substituent, preferably represents an aromatic group having 6–15 carbon atoms.

As diol compounds having carboxyl group represented in the formula (13), (14) and (15), specifically, the followings indicated below are included.

Namely, 3,5-dihydroxybenzoic acid, 2,2-bis(hydroxymethyl)propionic acid, 2,2-bis(hydroxyethyl) propionic acid, 2,2-bis(3-hydroxypropyl)propionic acid, bis(hydroxymethyl)acetic acid, bis(4-hydroxyphenyl)acetic acid, 2,2-bis(hydroxymethyl)acetic acid, 4,4-bis(4-hydroxyphenyl) pentanoic acid, tartaric acid, N,N-dihydroxyethyl glycine, N,N-bis(2-hydroxyethyl)-3-carboxy-propionamide and the like.

In the present invention, as a preferable tetracarbonic acid-2-anhydride used for synthesis of a specific polyurethane resin, ones represented by the formula (16), (17) and (18) are listed.

(16)

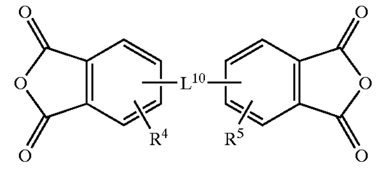

(17)

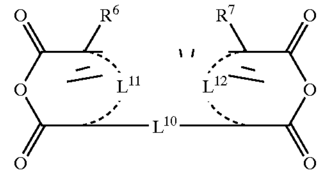

(18)

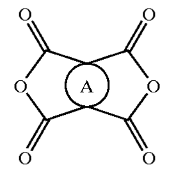

In the above formula, $L^{10}$ represents a single bond and bivalent aliphatic or aromatic hydrocarbon group, —CO—, —SO—, $—SO_2—$, —O—, or —S— which may have a substituent (e.g., alkyl, aralkyl, aryl, alkoxy, halogeno, ester and amide), and preferably represents a single bond, a bivalent aliphatic hydrocarbon group having 1–15 carbon atoms, —CO—, —SO—, $—SO_2—$, —O—, or —S—. $R^4$ and $R^5$ may be the same or different and represent a hydrogen atom, an alkyl group, an aralkyl group, an aryl group, an alkoxy group or a halogeno group, preferably a hydrogen atom, an alkyl group having 1–8 carbon atoms, an aryl group having 6–15 carbon atoms, an alkoxy group having 1–8 carbon atoms or a halogeno group. Moreover, two of $L^{10}$, $R^4$ and $R^5$ may bond each other and form a ring.

$R^6$ and $R^7$ may be the same or different and represent a hydrogen atom, an alkyl group, an aralkyl group, an aryl group or a halogeno group, preferably represent a hydrogen atom, an alkyl group having 1–8 carbon atoms or an aryl group having 6–15 carbon atoms. Moreover, two of $L^{10}$, $R^6$ and $R^7$ may bond and form a ring. $L^{11}$ and $L^{12}$ may be the same or different and represent a single bond, double bond or bivalent aliphatic hydrocarbon group, and preferably represent a single bond, double bond or methylene group. A represents a mononuclear or polynuclear aromatic ring. Preferably $L^{11}$ and $L^{12}$ represent an aromatic ring having 6–18 carbon atoms.

As compounds represented by the formula (16), (17) and (18), specifically the followings indicated below are included.

Namely, pyromellitic 2-anhydride, 3,3',4,4'-benzophentetracarbonic 2-anhydride, 3,3',4,4'-diphenyltetracarbonic 2-anhydride, 2,3,6,7-naphthalenetetracarbonic 2-anhydride, 1,4,5,8-naphthatetracarbonic 2-anhydride, 4,4'-sulfonyldiphthalic 2-anhydride, 2,2-bis(3,4-dicarboxyphenyl)propane 2-anhydride, bis(3,4-dicarboxyphenyl)ether 2-anhydride, 4,4'-[3,3'-(alkylphosphoryldiphenylene)-bis(iminocarbonyl)]diphthalic 2-anhydride, aromatic tetracarbonic 2-anhydride such as adduct of hydroquinone acetate and trimellitic anhydride, adduct of diacetyldiamine and trimellitic anhydride; alicyclic tetracarbonic 2-anhydride such as 5-(2,5-dioxotetrahydrofuril)-3-methyl-3-cyclohexy-1,2-dicarbonic anhydride (Epiclone B-4400, made by Dainippon Ink Chemical Industry, Co., Ltd.), 1,2,3,4-cyclopentane tetracarbonic 2-anhydride, 1,2,4,5-cyclohexan tetracarbonic 2-anhydride, tetrahydrofuran tetracarbonic 2-anhydride; aliphatic tetracarbonic 2-anhydride such as 1,2,3,4-butane tetracarbonic 2-anhydride, 1,2,4,5-pentane tetracarbonic 2-anhydride and the like are listed.

As methods for introducing a structural unit derived from the compound in which these tetracarbonic 2-anhydride is ring-opened with a diol compound into polyurethane resin, for example, the following methods are included.

a) a method of reacting the compound of an alcoholic terminal obtained by ring-opening tetracarbonic 2-anhydride with a diol compound and diisocyanate compound.

b) a method of reacting an urethane compound of an alcoholic terminal obtained by reacting a diisocyanate compound under the conditions of excess of a diol compound and tetracarbonic 2-anhydride.

Moreover, as diol compounds used at the time, specifically the followings indicated below are included.

Namely, ethylene glycol, diethylene glycol, triethylene glycol, tetraethylene glycol, propylene glycol, dipropylene glycol, polyethylene glycol, polypropylene glycol, neopentyl glycol, 1,3-butylene glycol, 1,6-hexanediol, 2-butene-1,4-diol, 2,2,4-trimethyl-1,3-pentane diol, 1,4-bis-β-hydroxyethoxy cyclohexane, cyclohexane dimethanol, tricyclodecane dimethanol, hydrogeneration A, hydrogeneration F, adduct of ethyleneoxide of bisphenol A, hydrogeneration bisphenol A, adduct of ethyleneoxide of bisphenol F, adduct of propyleneoxide of bisphenol F, adduct of ethyleneoxide of hydrogeneration bisphenol A, adduct of propyleneoxide of hydrogeneration bisphenol A, hydroquinone dihydroxyethylether, p-xylene glycol, dihydroxyethyl sulfone, bis(2-hydroxyethyl)-2,4-trilenedicarbamate, 2,4-trilene-bis(2-hydroxyethylcarbamide), bis(2-hydroethyl)-m-xylenedicarbamate, bis(2-hydroxyethyl) isophthalate and the like are listed.

Furthermore, synthesis of a specific polyurethane resin can be carried out by the combined use of the other diol compounds which do not have carboxyl group and may have the other substituents which do not react with isocyanate.

As such diol compounds, the followings indicated below are included.

$$HO\text{-}L^{13}\text{-}O\text{—}CO\text{-}L^{14}\text{-}CO\text{—}O\text{-}L^{13}\text{-}OH \quad (19)$$

$$HO\text{-}L^{14}\text{-}CO\text{—}O\text{-}L^{13}\text{-}OH \quad (20)$$

In the above-mentioned formula, $L^{13}$ and $L^{14}$ may be the same or different and represent a bivalent aliphatic hydrocarbon group, an aromatic hydrocarbon group or a heterocycle group which may have a substituent (e.g., respective groups such as an alkyl group, an aralkyl group, an aryl group, an alkoxy group, an aryloxy group, halogen atoms such as —F, —Cl, —Br, —I and the like are included). $L^{13}$ and $L^{14}$ may have other functional groups which do not react with an isocyanate group, for example, a carbonyl group, an ester group, an urethane group, an amide group, an ureido group and the like according to the necessity. It should be noted that a ring may be formed by $L^{13}$ and $L^{14}$.

Moreover, as specific examples of compounds represented by the above-mentioned formula (19) or (20), the followings indicated below (exemplified compound No. 19)-(exemplified compound No. 35) are included.

(No. 19)

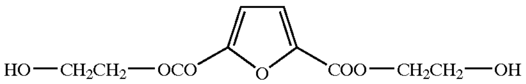

(No. 20)

$HO—CH_2CH_2—OCO—CH{=}CH—COO—CH_2CH_2—OH$ (No. 21)

$HO—CH_2CH_2—OCO—(CH_2)_{11}—COO—CH_2CH_2—OH$ (No. 22)

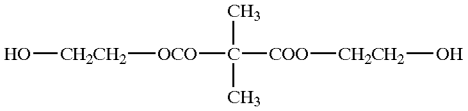

(No. 23)

$HO—CH_2CH_2—OCO—C{\equiv}C—COO—CH_2CH_2—OH$ (No. 24)

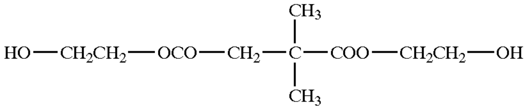

(No. 25)

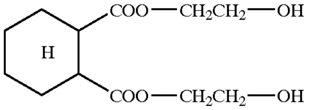

(No. 26)

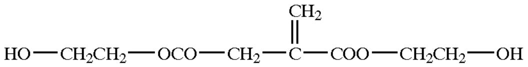

(No. 27)

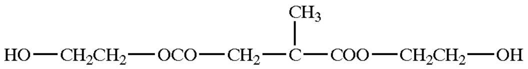

(No. 28)

$HO—CH_2CH_2—OCO—CH_2CH_2—CO—COO—CH_2CH_2—OH$

-continued (No. 29)

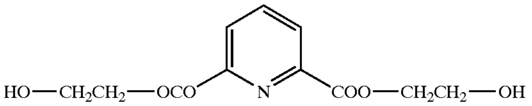

(No. 30)

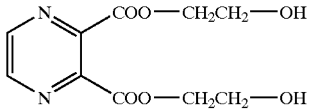

(No. 31)

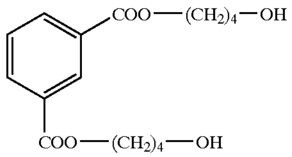

(No. 32)

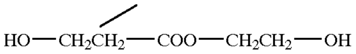

(No. 33)

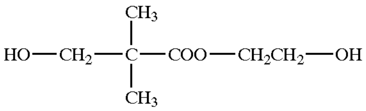

(No. 34)

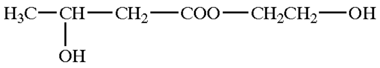

(No. 35)

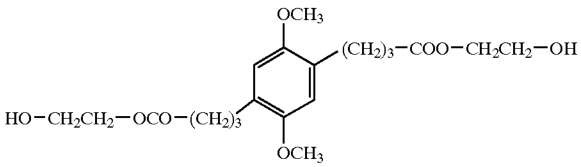

Moreover, diol compounds represented below by the formula (21) and the formula (22) can be also preferably used.

$HO(CH_2)_cOH$ (21)

(22)

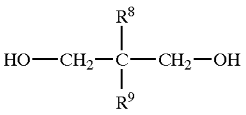

In the above-mentioned formula, $R^8$ and $R^9$ may be the same or different, respectively, and are alkyl groups which may have a substituent, c represents an integer of 2 or more, and preferably an integer of 2–100.

As diol compounds represented by the formula (21) and (22), specifically the followings indicated below are listed.

Namely, as for the formula (21), ethylene glycol, 1,3-propane diol, 1,4-butane diol, 1,5-pentane diol, 1,6-hexane diol, 1,7-heptane diol, 1,8-octane diol and the like are listed, and as for the formula (22), the compounds indicated below and the like.

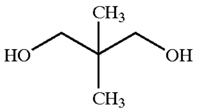

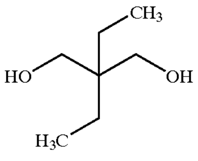

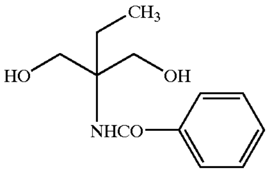

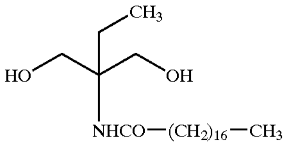

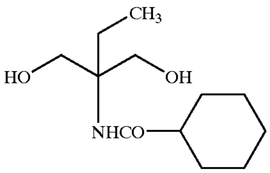

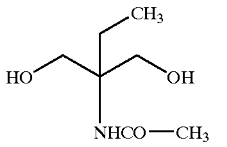

Moreover, diol compounds indicated by the following formula (23) and the formula (24) can be also preferably used.

$$HO\text{-}L^{15}\text{-}NH\text{—}CO\text{-}L^{16}\text{-}CO\text{—}NH\text{-}L^{15}\text{-}OH \quad (23)$$

$$HO\text{-}L^{16}\text{-}CO\text{—}NH\text{-}L^{15}\text{-}OH \quad (24)$$

In the above-mentioned formula, it will be good that $L^{15}$ and $L^{16}$ may be the same or different, respectively, and represent a bivalent aliphatic hydrocarbon group, an aromatic hydrocarbon group or a heterocycle group which may have a substituent (e.g., alkyl, aralkyl, aryl, alkoxy, aryloxy, halogen atoms (—F, —Cl, —Br, —I) and the like are included). $L^{15}$ and $L^{16}$ may have other functional groups which do not react with an isocyanate group, for example, carbonyl, ester, urethane, amide, ureido groups and the like according to the necessity. It should be noted that a ring may be formed by $L^{15}$ and $L^{16}$.

Moreover, as specific examples of the compounds represented by the formula (23) or (24), the followings indicated below are included.

(No. 36)

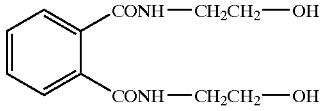

(No. 37)

$HO—CH_2CH_2—NHCO—CH{=}CH—CONH—CH_2CH_2—OH$ (No. 38)

$HO—CH_2CH_2—NHCO—C{\equiv}C—CONH—CH_2CH_2—OH$ (No. 39)

$HO—CH_2CH_2—NHCO—(CH_2)_3—CONH—CH_2CH_2—OH$

-continued (No. 40)

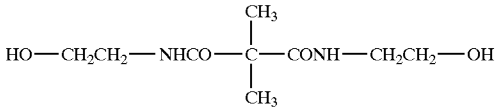

(No. 41)

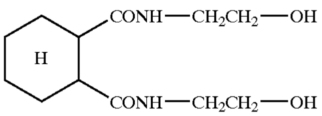

(No. 42)

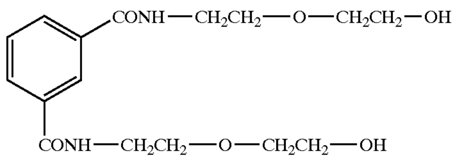

(No. 43)

$HO—CH_2CH_2—O—CH_2CH_2—NHCO(CH_2)_4CONH—CH_2CH_2—O—CH_2CH_2—OH$ (No. 44)

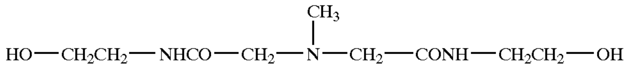

(No. 45)

$HO—CH_2CH_2—NHCO—CH_2—S—CH_2—CONH—CH_2CH_2—OH$

Moreover, diol compounds indicated by the following formula (25) and the formula (26) can be also preferably used.

$HO—Ar^2\text{-}(L^{17}\text{-}Ar^3)n\text{-}OH$ (25)

$HO—Ar^2\text{-}L^{17}\text{-}OH$ (26)

In the above-mentioned formula, $L^{17}$ represents a bivalent aliphatic hydrocarbon group which may have a substituent (for example, the respective groups such as alkyl, arlkyl, aryl, alkoxy, aryloxy and halogeno groups are preferable). $L^{17}$ may have the other functional groups which do not react with an isocyanate group, for example, ester, urethane, amide, ureido group according to the necessity. $Ar^2$ and $Ar^3$ may be the same or different and represent a bivalent aromatic hydrocarbon group which may have a substituent, and preferably represent an aromatic group having 6–15 carbon atoms. n represents an integer of 0–10.

Moreover, as diol compounds represented by the above-mentioned formula (25) or (26), specifically the followings indicated below are included.

Namely, catechol, resorcin, hydroquinone, 4-methylcatechol, 4-t-butylacatechol, 4-acetylcatechol, 3-methoxycatechol, 4-phenylcatechol, 4-methylresorcin, 4-ethylresorcin, 4-t-butylresorcin, 4-hexylresorcin, 4-chlororesorcin, 4-benzylresorcin, 4-acetylresorcin, 4-carbomethoxyresorcin, 2-methylresorcin, 5-methylresorcin, t-butylhydroquinone, 2,5-di-t-butylhydroquinone, 2,5-di-t-amylhydroquinone, tetramethylhydroquinone, tetrachlorohydroquinone, methylcarboaminohydroquinone, methylureidohydroquinone, methylthiohydroquinone, benzonorbornene-3,6-diol, bisphenol A, bisphenol S, 3,3'-dichlorobisphenol S, 4,4'-dihdroxybenzophenone, 4,4'-dihydroxybiphenyl, 4,4'-thiodiphenol, 2,2'-dihydroxydiphenylmetane, 3,4-bis(p-hydroxyphenyl)hexane, 1,4-bis(2-(p-hydroxyphenyl) propyl) benzene, bis(4-hydroxyphenol) methylamine, 1,3-dihydroxynaphthalene, 1,4-dihydroxynaphthalene, 1,5-dihydroxynaphthalene, 2,6-dihydroxynaphthalene, 1,5-dihydroxy anthraquinone, 2-hydroxybenzylalcohol, 4-hydroxybenzylalcohol, 2-hydroxy-3,5-di-t-butylbenzylalcohol, 4-hydroxy-3,5-di-t-butylbenzylalcohol, 4-hydroxyphenethylalcohol, 2-hydroxyethyl-4-hydroxybenzoate, 2-hydroxyethyl-4-hydroxyphenylacetate, resorcinmono-2 hydroxyethylether and the like are listed.

Diol compounds represented by the following formula (27), the formula (28) or the formula (29) can be also preferably used.

(27)

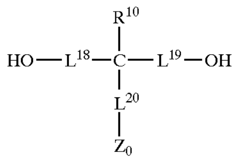

(28)

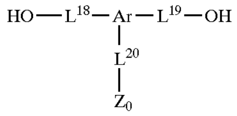

(29)

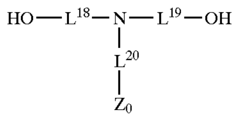

In the above-mentioned formula, $R^{10}$ represents a hydrogen atom and alkyl, aralkyl, aryl, alkoxy, aryloxy groups which may have a substituent (e.g., cyano, nitro, halogen atom (—F, —Cl, —Br, —I), $—CONH_2$, $—COOR^{11}$, $—OR^{11}$, $—NHCONHR^{11}$, $—NHCOOR^{11}$, $—NHCOR^{11}$, $—OCONHR^{11}$, $—CONHR^{11}$ (wherein $R^{11}$ represents an alkyl group having 1–10 carbon atoms, an aralkyl group having 7–15 carbon atoms) are included), preferably represents a hydrogen atom, an alkyl group having 1–8 piece of carbon atoms, an aryl group having 6–15 carbon atoms. $L^{18}$, $L^{19}$ and $L^{20}$ may be the same or different, respectively, and represent a single bond and a bivalent or aromatic hydrocarbon group which may have a substituent (for example, the respective group of an alkyl, an aralkyl, an aryl, an alkoxy or a halogen group is preferable), preferably represent an alkylene group having 1–20 carbon atoms and an arylene group having 6–15 carbon atoms, and more preferably an alkylene group having 1–8 carbon atoms. $L^{18}$, $L^{19}$ and $L^{20}$ may have the other functional groups which do not react with an isocyanate group, for example, carbonyl, ester, urethane, amide, ureido, ether groups. It should be noted that a ring may be formed by two or three of $R^{10}$, $L^{18}$, $L^{19}$ and $L^{20}$. Ar represents trivalent aromatic hydrocarbon groups which may have a substituent, preferably represents an aromatic group having 6–15 carbon atoms. Zo represents the following groups.

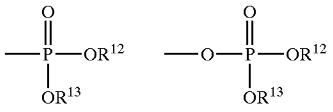

Wherein $R^{12}$ and $R^{13}$ may be the same or different, respectively, and represent a hydrogen atom, sodium, potassium, an alkyl group and an aryl group, preferably a hydrogen atom, an alkyl group having 1–8 carbon atoms and an aryl group having 6–15 carbon atoms.

Diol compounds having phosphonic acid, phosphoric acid and/or these ester groups represented by the above-mentioned formula (27), (28) or (29) are synthesized by a method indicated below.

After a hydroxy group of a halogen compound represented by the following general formula (30), (31) and (32) is protected according to the necessity, the synthesis is conducted by the hydroxy group being phosphonate-esterified by Michaelis-Arbuzov reaction represented by the formula (33), and further is hydrolyzed by hydrogen bromide or the like according to the necessity.

(30)

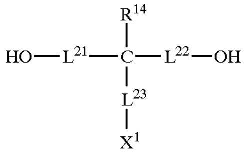

(31)

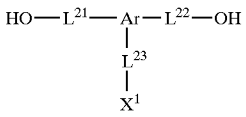

(32)

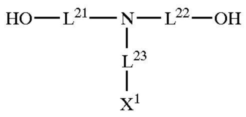

(33)

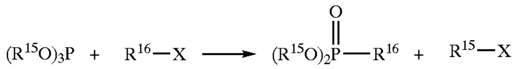

In the above-mentioned formula, $R^{14}$, $L^{21}$, $L^{22}$, $L^{23}$ and Ar represent the same meaning in the case of the formula (27), (28) and (29). $R^{15}$ represents an alkyl group and aryl group, preferably represents an alkyl group having 1–8 carbon atoms and an aryl group having 6–15 carbon atoms. $R^{16}$ is a residue which is the resultant of $X^1$ of the formula (30), (31) and (32) having been removed, and $X^1$ represents a halogen atom, preferably represents Cl, Br and I.

Moreover, synthesis is conducted by hydrolyzing after reaction with phosphorus oxychloride represented by the following formula (34) indicated below.

(34)

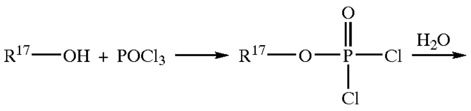

-continued

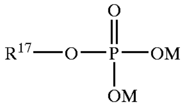

In the above-mentioned formula, $R^{17}$ has the same meaning in the case of the formula (33), M represents a hydrogen atom, sodium or potassium.

In the case where a polyurethane of the present invention has a phosphonic acid group, synthesis may be conducted by hydrolyzing with hydrogen bromide after a diisocyanate compound represented by the aforementioned general formula (4) and a diol compound having a phosphonic acid ester group represented by the aforementioned formula (27), (28) or (29) are reacted and polyurethane-resinified.

Moreover, similarly to diol compounds, the compound containing an amino group indicated below may be reacted with a diisocyanate compound represented by the general formula (4), to form an urea structure thereby to be incorporated in a structure of polyurethane resin.

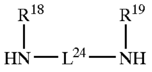

(35)

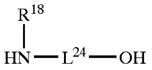

(36)

In the above-mentioned formula, $R^{18}$ and $R^{19}$ may be the same or different, respectively, and represent a hydrogen atom and alkyl, aralkyl and aryl groups which may have a substituent (for example, an alkoxy group, a halogen atom (—F, —Cl, —Br, —I), an ester group, a carboxyl group are included), preferably represent a hydrogen atom, an alkyl group having 1–8 carbon atoms and an aryl group having 6–15 carbon atoms, which may have a carboxyl group as a substituent. $L^{24}$ represents a bivalent aliphatic hydrocarbon group, an aromatic hydrocarbon group or a heterocyclic group, which may have a substituent (for example, alkyl, aralkyl, aryl, alkoxy, aryloxy, halogen atom (—F, —Cl, —Br, —I), carboxyl groups are included). $L^{24}$ may have the other functional groups which do not react with an isocyanate group, for example, carbonyl, ester, urethane, amide groups according to the necessity. It should be noted that a ring may be formed by two of $R^{18}$, $L^{24}$ and $R^{19}$.

Moreover, as the specific examples of compounds represented by the general formula (35) and (36), the followings indicated below are included:

Namely, aliphatic diamine compounds such as ethylenediamine, propylenediamine, tetramethylenediamine, pentamethylenediamine, hexamethylenediamine, heptamethylenediamine, octamethylenediamine, dodecamethylenediamine, propane-1,2-diamine, bis(3-aminopropyl) methylamine, 1,3-bis(3-aminopropyl)tetramethylsiloxane, piperazine, 2,5-dimethylpiperazine, N-(2-aminoethyl)piperazine, 4-amino-2,2,6,6-tetramethylpiperidine, N,N-dimethylethylenediamine, lysine, L-cystine, isophoronediamine and the like;

aromatic diamine compounds such as o-phenyldiamine, m-phenylenediamine, p-phenylenediamine, 2,4-trilenediamine, benzidine, o-ditoluidine, o-dianisidine, 4-nitro-m-phenylenediamine, 2,5-dimethoxy-p-phenylenediamine, bis-(4-aminophenyl) sulfone, 4-carboxy-o-phenylenediamine, 3-carboxy-m-phenylenediamine, 4,4'-diaminophenylether, 1,8-naphthalenediamine and the like;

heterocyclic amine compounds such as 2-aminoimidazole, 3-aminotriazole, 5-amino-1H-tetrazole, 4-aminopyrazole, 2-aminobenzimidazole, 2-amino-5-carboxy-triazole, 2,4-diamino-6-methyl-S-triazine, 2,6-diaminopyridine, L-hystidine, DL-tryptophan, adenine and the like;

aminoalcohol or aminophenol compounds such as ethanolamine, N-methylethanolamine, N-ethylethanolamine, 1-amino-2-propanol, 1-amino-3-propanol, 2-aminoethoxyethanol, 2-aminothioethoxyethanol, 2-amino-2-methyl-1 propanol, p-aminophenol, m-aminophenol, o-aminophenol, 4-methyl-2-aminophenol, 2-chloro-4-aminophenol, 4-methoxy-3-aminphenol, 4-hydroxybenzylamine, 4-amino-1-naphthol, 4-aminosalicylic acid, 4-hydroxy-N-phenylglycine, 2-aminobenzylalcohol, 4-aminophenethyl alcohol, 2-carboxy-5-amino-1-naphthol, L-tyrosine and the like.

A specific polyurethane resin capable of being employed in the present invention is synthesized by adding the known activated catalyst according to respective reactivity and heating it. The mole ratio of a diisocyanate and diol compound for use is preferably 0.8:1–1.2:1, in the case where an isocyanate group remains in a polymer terminal, it is synthesized in a form where an isocyanate group does not remain in a final stage by being treated with alcohols, amines or the like.

A specific polyurethane resin of the present invention is preferably employed even if those have unsaturated bonds in a polymer terminal, a principal chain or a side chain. Crosslinking reaction takes place with polymerizable compounds or between polyurethane resins, as a result, photocuring intensity is increased, when applied to a planographic plate, a plate material excellent in plate life can be given. As an unsaturated bond, carbon-carbon double bond is particularly preferable because of the easiness of occurrence of crosslinking reaction.

As a method of introducing an unsaturated group in a terminal of a polymer, the following method indicated exists: specifically, in the case where an isocyanate group remains in the terminal of the polymer in the process of synthesis of the aforementioned polyurethane resin, it will be good that alcohols, amines or the like having a unsaturated group is used in the process of treating by alcohols, amines or the like. As such compounds, specifically, the followings can be listed:

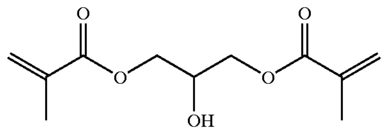

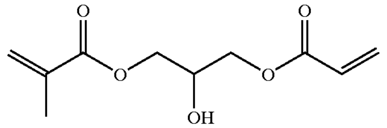

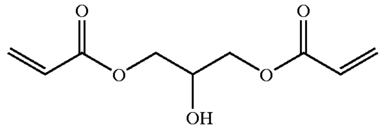

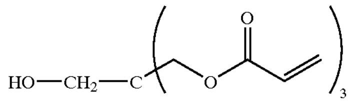

-continued

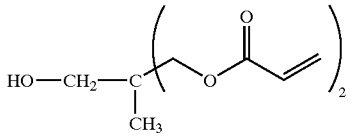

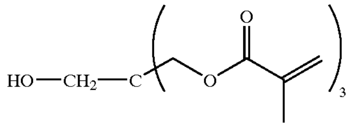

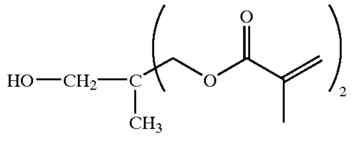

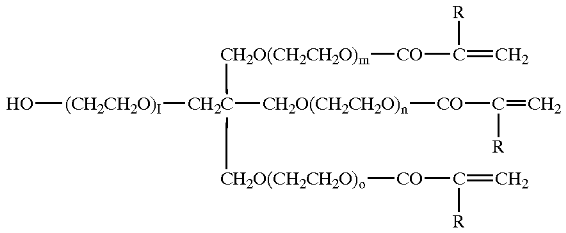

I, m, n, o = integers of 1–20
R = hydrogen or methyl group

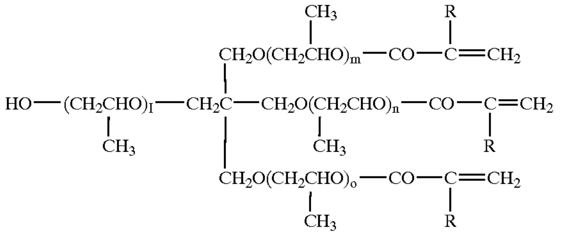

I, m, n, o = integers of 1–20
R = hydrogen or methyl group

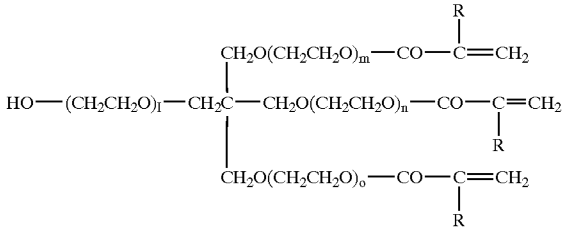

I, m, n, o = integers of 1–20
R = hydrogen or methyl group

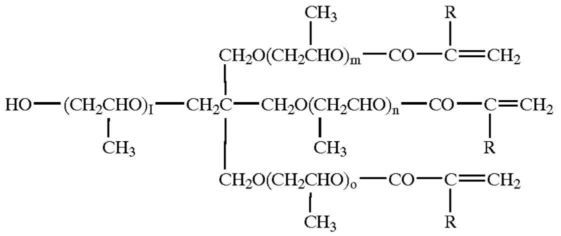

I, m, n, o = integers of 1–20
R = hydrogen or methyl group

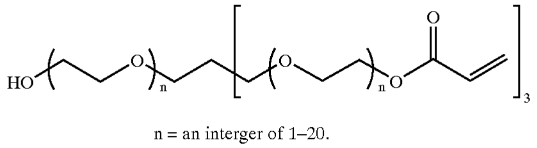

n = an interger of 1–20.

-continued

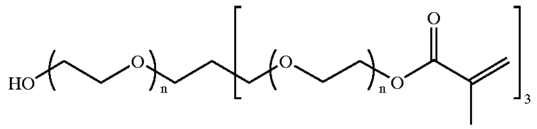

n = an interger of 1–20.

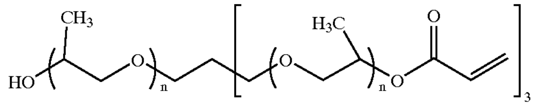

n = an interger of 1–20.

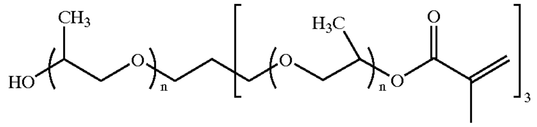

n = an interger of 1–20.

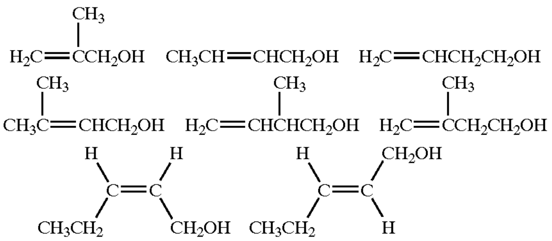

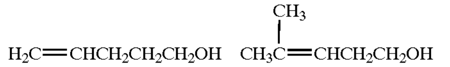

$H_2C{=}CH(CH_2)_7CH_2OH$  $H_2C{=}CH(CH_2)_8CH_2OH$ $H_2C{=}CHCH_2NH_2$  $CH_3(CH_2)_7CH{=}CH(CH_2)_7CH_2NH_2$

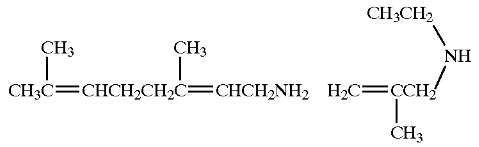

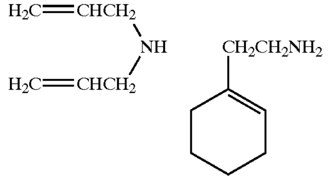

As a method of introducing an unsaturated group in principal chain or side chain, there exists a method in which a diol compound having an unsaturated group is employed for polyurethane resin synthesis. As diol compounds having an unsaturated group, specifically the following compounds can be listed:

Diol compounds represented by the formula (37) or (38). Concretely, the followings indicated below are listed:

$$HO{-}CH_2{-}C{\equiv}C{-}CH_2{-}OH \quad (37)$$

$$HO{-}CH_2{-}CH{=}CH{-}CH_2{-}OH \quad (38)$$

As diol compounds represented by the formula (37), specifically, 2-butene-1,4-diol or the like is listed, and as diol compounds represented by the formula (38), cis-2-butene-1,4-diol, trans-2-butene-1,4-diol or the like is listed, respectively.

Diol compounds having an unsaturated group in a side chain. Concretely, the following compounds indicated below can be listed:

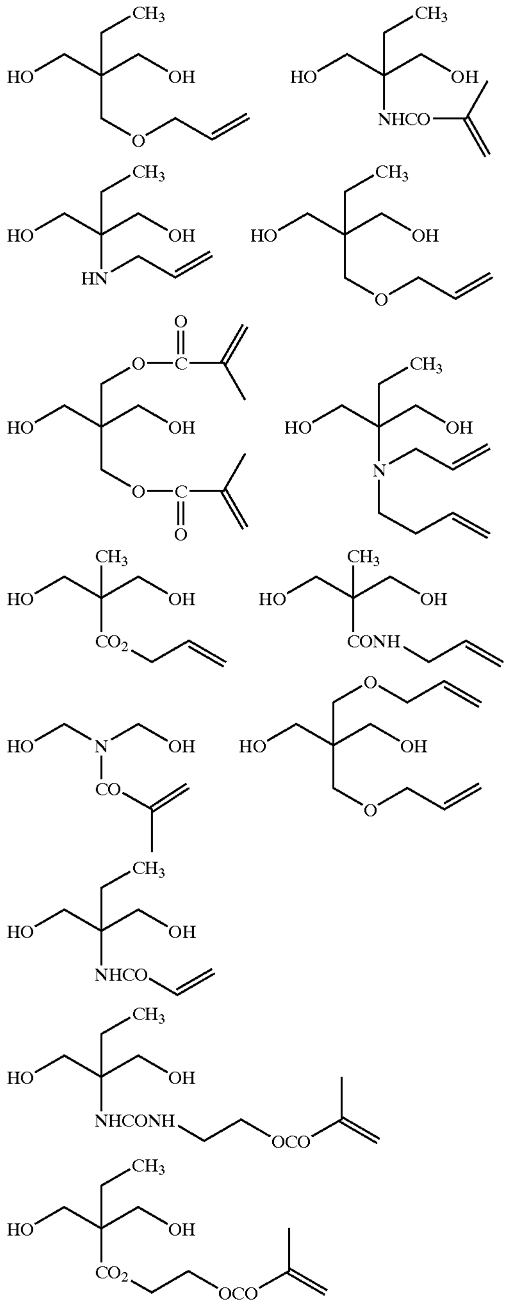

A specific polyurethane resin of the present invention is preferably the resin containing an aromatic group in principal chain and/or side chain. It has an aromatic group content is more preferably in the range of 10–80 weight % in the polyurethane resin.

Such a specific polyurethane resin is preferably a polyurethane resin having a carboxyl group, and as for the content, 0.4 meq/g or more of carboxyl group is preferably contained, and more preferably in the range of 0.4–3.5 meq/g.

Moreover, as molecular weight of a specific polyurethane resin, it has preferably 1,000 or more in weight-average molecular weight, and more preferably in the range of 10,000–300,000.

A specific polyurethane resin of the present invention may be used either separately or by mixing two species or more. Moreover, provided that the effect of the present invention is not damaged, the other polymeric compound can be mixed and used instead of a polyurethane resin. In this case, the other polymeric compound is preferably less than 90% by weight in the total polymeric compound containing a polyurethane resin, and more preferably less than 70% by weight.

The content of a specific polyurethane resin contained in an image recording material of the present invention is about 5–95% by weight in solids content, and preferably about 10–85% by weight. In the case where the addition amount is less than 5% by weight, when image-forming, the strength of the image portion is not sufficient. Further, when the addition amount exceeds over 95% by weight, images are not formed.

The present invention is explained below in detail.

[(A-2) A Polymeric Compound which has on the Side Chain thereof a Group Represented by the General Formula (39) or the General Formula (40) and which is Insoluble in Water but Soluble in an Aqueous Alkaline Solution]

A polymeric compound which has on the side chain thereof at least one group represented by the general formula (39) or the general formula (40) and which is insoluble in water but soluble in an aqueous alkaline solution (this compound is hereinafter referred to as a specific polymer soluble in alkaline water upon occasion) is used as an essential component for another aspect of the heat mode corresponding negative-type image recording material of the present invention. Such a specific polymer soluble in an alkaline water needs to have in the structure thereof at least one of the above-mentioned groups. Therefore, the specific polymer soluble in an alkaline water may have any one of a group represented by the general formula (39) and a group represented by the general formula (40), or alternatively, the specific polymer soluble in an alkaline water may have both of these groups.

$$\text{—X—NH—Y—} \quad (39)$$

$$\text{-Z-NH—R} \quad (40)$$

wherein X and Y each represents a bivalent organic group with the proviso that at least one of X and Y represents —CO— or $SO_2$—; Z represents —CO— or $SO_2$—; and R represents a hydrogen atom or a monovalent organic group.

The polymeric compound of the present invention can be prepared by polymerizing one or more kinds of radical-polymeric compounds having in the structure thereof a group represented by the general formula (39) or a group represented by the general formula (40), or alternatively, by copolymerizing one or more kinds of radical-polymerizable compounds having in the structure thereof a group represented by the general formula (39) or a group represented by the general formula (40) with one or more kinds of radical-polymerizable compounds, i.e., which do not have the above-mentioned group, according to a conventional radical polymerization method. In the preparation of the polymerizable compound, a publicly known method, such as suspension polymerization or solution polymerization, can be employed.

Preferred examples of the group represented by the general formula (39) or the group represented by the general formula (40) include the groups having the structures represented by the following general formula (41) to (56), respectively:

$$\text{—CONH—}R^1 \quad (41)$$

$$\text{—NHCO—}R^2 \quad (42)$$

$$\text{—NH—CO—O—}R^3 \quad (43)$$

$$\text{—O—CO—NH—}R^4 \quad (44)$$

$$\text{—NH—CO—NH—}R^5 \quad (45)$$

$$\text{—NH—}SO_2\text{—}R^6 \quad (46)$$

$$\text{—}SO_2\text{—NH—}R^7 \quad (47)$$

$$\text{—CO—NH—}SO_2\text{—}R^8 \quad (48)$$

$$\text{—}SO_2\text{—NH—CO—}R^9 \quad (49)$$

$$\text{—NH—CO—NH—}SO_2\text{—}R^{10} \quad (50)$$

$$\text{—}SO_2\text{—NH—CO—NH—}R^{11} \quad (51)$$

$$\text{—CO—NH—}SO_2\text{—NH—}R^{12} \quad (52)$$

$$\text{—NH—}SO_2\text{—NH—CO—}R^{13} \quad (53)$$

$$\text{—}SO_2\text{—NH—}SO_2\text{—}R^{14} \quad (54)$$

$$\text{—C—CO—NH—}SO_2\text{—}R^{15} \quad (55)$$

$$\text{—}SO_2\text{—NH—}CO_2\text{—}R^{16} \quad (56)$$

In the formula, $R^1$, $R^4$, $R^5$, $R^7$, $R^{11}$, and $R^{12}$ each represents a hydrogen atom, an alkyl group, a cycloalkyl group, an aryl group, or an aralkyl group having 1 to 12 carbon atoms, each of which may have a substituent. $R^2$, $R^3$, $R^6$, $R^8$, $R^9$, $R^{10}$, $R^{13}$, $R^{14}$, $R^{15}$ and $R^{16}$ each represents an alkyl group, a cycloalkyl group, an aryl group, or an aralkyl group having 1 to 12 carbon atoms, each of which may have a substituent.

Among these groups, the groups having a —CONH group or a sulfonic acid generating group, represented by the general formula (41), (44), (45), (46), (47), (48), and (49), are preferable from the standpoint of effect.

Examples of the radical-polymerizable compounds having these groups include the compounds described in, for example, JP-A Nos. 63-89864, 63-226641, 2-866, 8-39082, and 11-171907 as well as the compounds described Japanese Patent Application Nos. 11-49769 and 11-286964 filed by the present applicant. Some illustrative nonlimiting examples include the following compounds.

(M1)

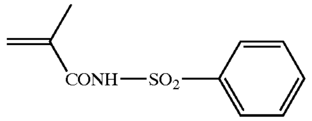

(M2)

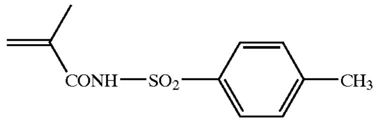

(M3)

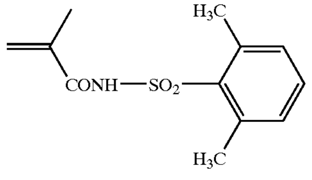

-continued
(M4)
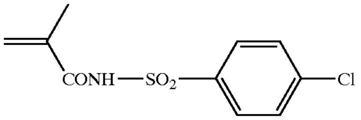
(M5)
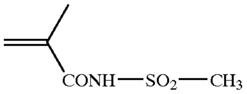
(M6)
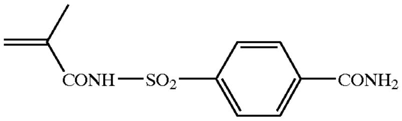
(M7)
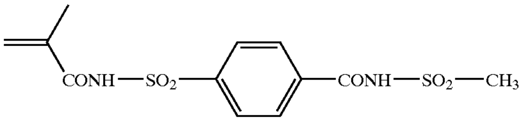
(M8)
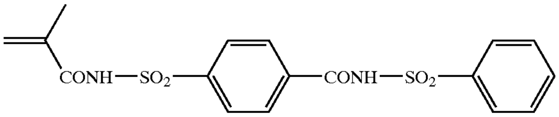
(M9)
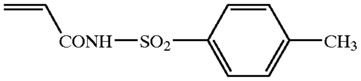
(M10)
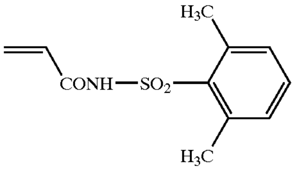
(M11)
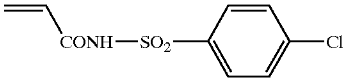
(M12)
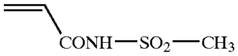
(M13)
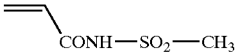
(M14)
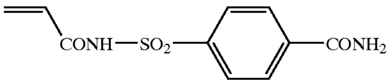
(M15)
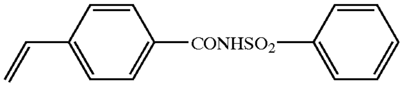
(M16)
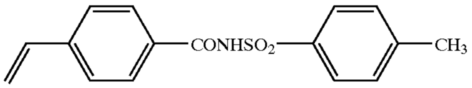
(M17)
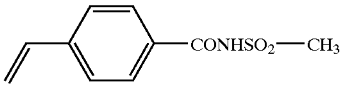
-continued
(M18)
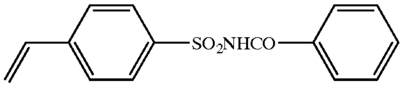
(M19)
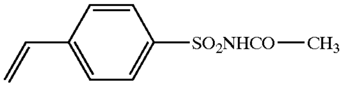
(M20)
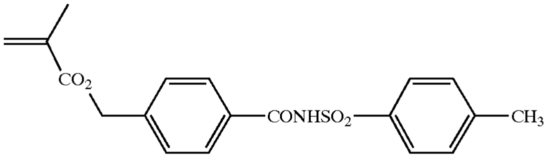
(M21)
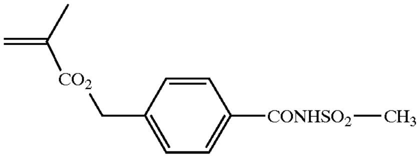
(M22)
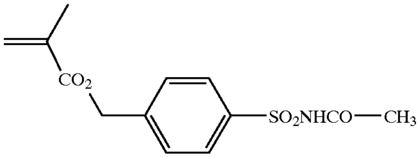
(M23)
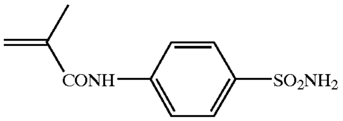
(M24)
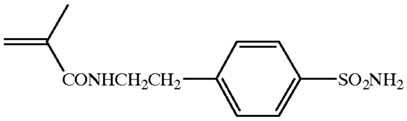
(M25)
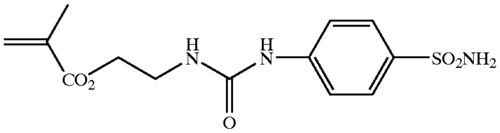
(M26)
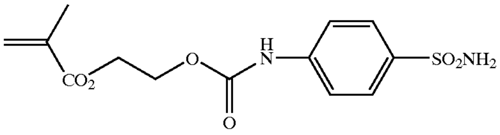
(M27)
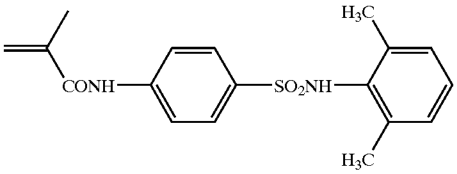
(M28)
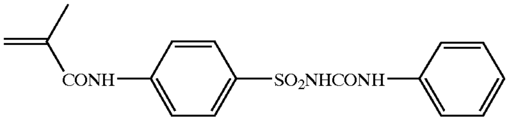

-continued
(M29)
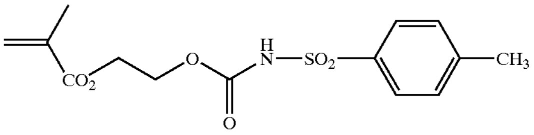
(M30)
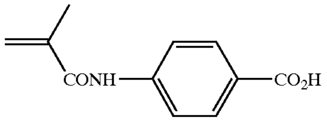
(M31)
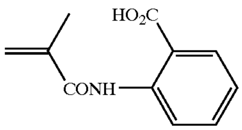
(M32)
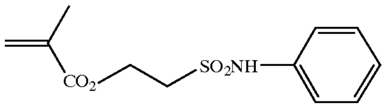
(M33)
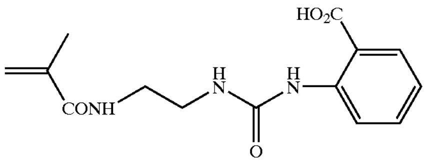
(M34)
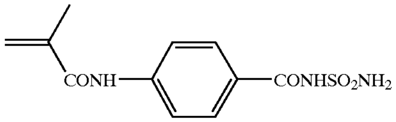
(M35)
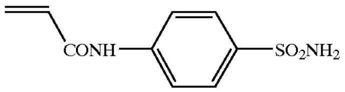
(M36)
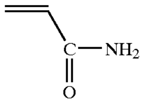
(M37)
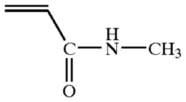
(M38)
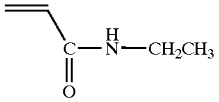
(M39)
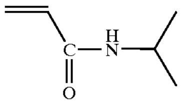
(M40)
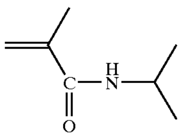
-continued
(M41)
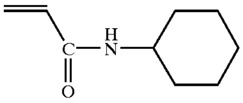
(M42)
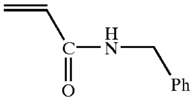
(M43)
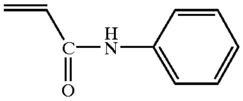
(M44)
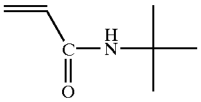
(M45)
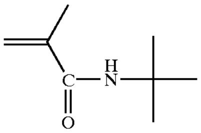
(M46)
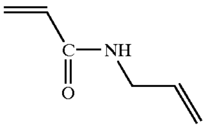
(M47)
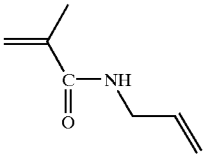
(M48)
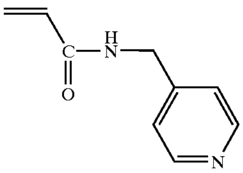
(M49)
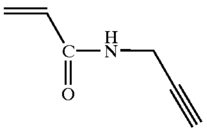
(M50)
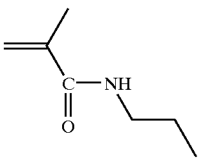
(M51)
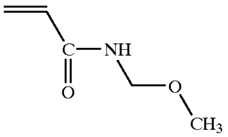

-continued (M52)

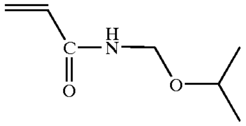

(M53)

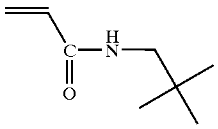

(M54)

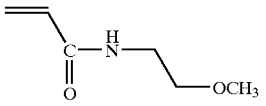

(M55)

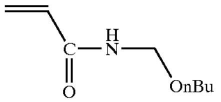

(M56)

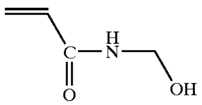

(M57)

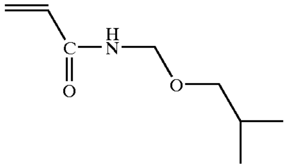

(M58)

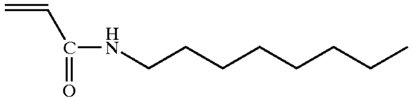

(M59)

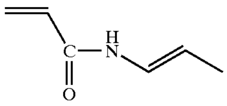

(M60)

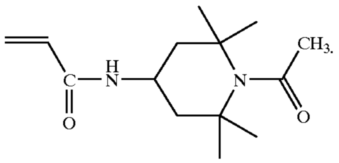

These radical-polymerizable compounds can be easily obtained as commercial products or by synthesis according to the method described in, for example, JP-A No. 2-866 or 2-167550.

Besides the radical-polymerizable compounds described above, it is also a preferred mode to copolymerize the specific polymer soluble in alkaline water for use in the present invention with other radical-polymerizable for improving performances such as image strength.

Examples of such radical-polymerizable compounds include the radical-polymerizable compounds selected from acrylic esters, methacrylic esters, N,N-di-substituted acryl amides, N,N-di-substituted methacryl amides, styrenes, acrylonitriles, methacrylonitriles, and the like.

Specific examples include the following. Acrylic esters such as alkyl acrylates (said alkyl having preferably 1 to 20 carbon atoms) (specifically methyl acrylate, ethyl acrylate, propyl acrylate, butyl acrylate, amyl acrylate, hexyl acrylate, octyl acrylate, t-octyl acrylate, chloroethyl acrylate, 2,2-dimethylhydroxypropyl acrylate, 5-hydroxypentyl acrylate, trimethylolpropane monoacrylate, pentaerythritol monoacrylate, glycidyl acrylate, benzyl acrylate, methoxybenzyl acrylate, furfuryl acrylate, tetrahydrofurfuryl acrylate, and the like), aryl acrylates (e.g., phenyl acrylate and the like), acrylic esters having in the lateral substituent thereof a carbon-carbon unsaturated bond (e.g., allyl acrylate, 2-allyloxyethyl acrylate, propargyl acrylate, and the like), methacrylic esters such as alkyl methacrylates (said alkyl having preferably 1 to 20 carbon atoms) (specifically methyl methacrylate, ethyl methacrylate, propyl methacrylate, isopropyl methacrylate, amyl methacrylate, hexyl methacrylate, cyclohexyl methacrylate, benzyl methacrylate, chlorobenzyl methacrylate, octyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, glycidyl methacrylate, furfuryl methacrylate, tetrahydrofurfuryl methacrylate, and the like), aryl methacrylates (e.g., phenyl methacrylate, cresyl methacrylate, naphthyl methacrylate, and the like), methacrylic esters having in the lateral substituent thereof a carbon-carbon unsaturated bond (e.g., allyl methacrylate, 2-allyloxyethyl methacrylate, propargyl methacrylate, and the like), styrenes such as styrene and alkylstyrenes (e.g., methylstyrene, dimethylstyrene, trimethylstyrene, ethylstyrene, diethylstyrene, isopropylstyrene, butylstyrene, hexylstyrene, cyclohexylstyrene, decylstyrene, benzylstyrene, chloromethylstyrene, trifluoromethylstyrene, ethoxymethylstyrene, acetoxymethylstyrene, and the like), alkoxystyrenes (e.g., methoxystyrene, 4-methoxy-3-methylstyrene, dimethylstyrene, and the like), halogenostyrenes (e.g., chlorostyrene, dichlorostyrene, trichlorostyrene, tetrachlorostyrene, pentachlorostyrene, bromostyrene, dibromostyrene, iodostyrene, fluorostyrene, trifluorostyrene, 2-bromo-4-trifluoromethylstyrene, 4-fluoro-3-trifluoromethylstyrene, and the like), acrylonitrile, meth acrylonitrile, and so on.

Among these radical-polymerizable compounds, suitably used are acrylic esters, methacrylic esters, and styrenes. Particularly suitably used are acrylic esters having in the lateral substituent thereof a carbon-carbon unsaturated bond (e.g., allyl acrylate, 2-allyloxyethyl acrylate, and propargyl acrylate), acryl methacrylates having in the lateral substituent thereof a carbon-carbon unsaturated bond (e.g., allyl methacrylate, 2-allyloxyethyl methacrylate, and propargyl methacrylate), and styrenes (e.g., p-allylstyrene).

These compounds may be used singly or in combinations of two or more. The contents of these components for copolymerization are preferably 0 to 95 mol % and particularly preferably 20 to 90 mol %.

In order to improve performances such as capability to remove non-image portions, the specific polymer soluble in alkaline water for use in the present invention may be copolymerized with a radical-polymerizable compound having an acid group. Examples of the acid groups borne by such radical-polymerizable compounds include carboxylic acid, sulfonic acid, phosphoric acid, and the like. Carboxylic acids are particularly preferable. Examples of the radical-polymerizable compounds containing carboxylic acids include acrylic acid, methacrylic acid, itaconic acid, crotonic acid, isocrotonic acid, maleic acid, and p-carboxystyrene. Particularly preferable are acrylic acid, methacrylic acid, and p-carboxystyrene.

These compounds may be used singly or in combinations of two or more. The contents of these components for copolymerization are preferably 0 to 85 mol % and particularly preferably 10 to 70 mol %.

The polymer soluble in alkaline water for use in the present invention may be a homopolymer. Alternatively, the polymer may be a copolymer of radical-polymerizable compounds each having a different group represented by the general formula (39) or the general formula (40), or a copolymer of one or more kinds of radical-polymerizable compounds having a group represented by the general formula (39) or the general formula (40) with one or more kinds of the other radical-polymerizable compounds described above, wherein the copolymer may be a block copolymer, a random copolymer, or a graft copolymer.

Examples of the solvents for use in the synthesis of these polymerizable compounds include ethylene dichloride, cyclohexanone, methyl ethyl ketone, acetone, methanol, ethanol, propanol, butanol, ethylene glycol monomethyl ether, ethylene glycol monoethyl ether, 2-methoxyethyl acetate, 1-methoxy-2-propanol, 1-methoxy-2-propyl acetate, N,N-dimethylformamide, N,N-dimethylacetamide, dimethyl sulfoxide, toluene, ethyl acetate, methyl lactate, and ethyl lactate.

These solvents may be used singly or in combinations of two or more.

The weight average molecular weight of the polymerizable compound of the present invention is preferably 2,000 or greater and more preferably in the range of 5,000 to 300,000.

The specific polymer soluble in alkaline water for use in the present invention may contain unreacted monomer. It is desirable that the content of the unreacted monomer in the polymerizable compound does not exceed 15% by weight.

The specific polymers soluble in alkaline water for use in the present invention may be used singly or as a mixture of two or more. Alternatively, a mixture of the specific polymer soluble in alkaline water for use in the present invention and other polymerizable compound that does not have the group represented by the general formula (39) or the general formula (40) may be used. In this case, the content of the polymerizable compound that does not have the group represented by the general formula (39) or the general formula (40) in the total polymerizable compounds is 90% by weight or less and more preferably 70% by weight or less.

The content of (A) the specific polymer soluble in alkaline water in the image recording material of the present invention is about 5 to 95% by weight and preferably about 10 to 85% by weight based on the solid components.

[(B) Radical Polymerizable Compound]

A radical-polymerizable compound used for the present invention is a radical-polymerizable compound having at least one ethylene character unsaturated double bond, selected from the compounds having at least one terminal ethylene character unsaturated bond, preferably two or more of terminal ethylene character unsaturated bonds. Such a group of compounds is widely known in the art, in the present invention, these can be used without any particular limitations.

These compounds have chemical forms such as monomer, pre-polymer, namely, dimer, trimer and oligomer, or the mixture thereof and copolymer thereof.

As examples of monomer and its copolymer, unsaturated carbonic acid (e.g., acrylic acid, methacrylic acid, itaconic acid, crotonic acid, isocrotonic acid, maleic acid or the like), and its esters, amides are listed, preferably esters of unsaturated carbonic acid and an aliphatic multivalent alcoholic compound, amides of unsaturated carbonic acid and an aliphatic multivalent amine compound are employed. Moreover, unsaturated carbonic acid ester having a nucleophilic substituent such as a hydroxy group, an amino group, a mercapto group and the like, amides and monofunctional or polyfunctional isocyanates, addition reactants with epoxies, dehydration and condensation reactants with monofunctional or polyfunctional carbonic acid or the like are also preferably used. Moreover, addition reactants of unsaturated carbonic acid ester or amides having an electrophilic substituent such as an isocyanate group, an epoxy group or the like and monofunctional or polyfunctional alcohols, amines and thiols, further, substitution reactants of unsaturated carbonic acid ester or amides having elimination character substituents such as a halogen group, a tosyloxy group or the like, and monofunctional or polyfunctional alcohols, amines and thiols are also preferable. Moreover, as the other example, a group of compounds in which unsaturated sulfonic acid, styrene or the like has been replaced instead of the above-mentioned unsaturated carbonic acid can be also used.

As specific examples of radical-polymerizable compounds which are esters of an aliphatic multivalent alcohol compound and unsaturated carbonic acid, as acrylic esters, ethylene glycol diacrylate, triethylene glycol diacrylate, 1,3-butane diol diacrylate, tetramethylene glycol diacrylate, propylene glycol diacrylate, neopentyl diacrylate, trimethylol propane triacrylate, trimethylol propane (acryloyl oxypropyl) ethyl, trimethylol ethane triacrylate, hexane diol diacrylate, 1,4-cyclohexan diol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri (acryloyloxyethyl) isocyanate, polyester acrylate oligomer and the like are listed.

As methacrylic esters, tetramethylene glycol dimethacrylate, triethylene glycol dimethacrylate, neopentyl glycol dimethacrylate, trimethylol propane trimethacrylate, trimethylol ether trimethacrylate, ethylene glycol dimethacrylate, 1,3-butane diol dimethacrylate, hexane diol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis [p-(3-methacryloxy-2-hydroxypropoxy)phenyl]dimethylmethane, bis-[p-(methacryloxyethoxy)phenyl]dimethylmethane and the like are listed.

As itaconic esters, ethylene glycol diitaconate, propylene glycol diitaconate, 1,3-butane diol diitaconate, 1,4-butane diol diitaconate, tetramethylene glycol diitaconate, pentaerythritol diitaconate, sorbitol tetraitaconate and the like are listed.

As crotonic esters, ethylene glycol dicrotonate, tetramethylene glycol dicrotonate, pentaerythritol diisocrotonate, sorbitol tetraisocrotonate and the like are listed.

As isocrotonic esters, ethylene glycol diisocrotonate, pentaerythritol diisocrotonate, sorbitol tetraisocrotonate and the like are listed.

As maleic esters, ethylene glycol dimaleate, triethylene glycol dimaleate, pentaerythritol dimaleate, sorbitol tetramaleate and the like are listed.

As the other examples of esters, for example, aliphatic alcoholic esters mentioned in Japanese Patent Application Publication No. 46-27926, JP-B No. 51-47334, and JP-A No. 57-196231, compound having an aromatic skeleton mentioned in JP-A No. 59-5240, JP-A No. 59-5241, JP-A No. 2-226149, compound containing an amino group mentioned in JP-A No. 1-165613 and the like are preferably employed.

Moreover, as specific examples of monomers of amides of an aliphatic multivalent amine compound and unsaturated carbonic acid, methylene bis-acrylamide, methylene bis-methacrylamide, 1,6-hexamethylene bis-acrylamide, 1,6-hexamethylene bis-methacrylamide, diethylene triamine triacrylamide, xylene bis acrylamide, xylene bis methacrylamide and the like are listed.

As the other preferable examples of amide monomers, compound having cyclohexylene structure mentioned in JP-B No. 54-21726 is capable of being listed.

Moreover, urethane based addition polymerizable compound manufactured by employing addition reaction of isocyanate and hydroxyl group is also preferable, and as such specific example, for example, a vinyl urethane compound containing two or more polymeric vinyl groups in one molecule, in which vinyl monomer containing a hydroxyl group represented by the following formula (57) is added to a polyisocyanate compound having two or more isocyanate groups in one molecule mentioned in JP-B No. 48-41708 and the like are listed.

$$CH_2{=}C(R^{41})COOCH_2CH(R^{42})OH \qquad \text{General formula (57)}$$

(provided that $R^{41}$ and $R^{42}$ represent H or $CH_3$.)

Moreover, urethane acrylates as mentioned in JP-A No. 51-37193, JP-B No. 2-32293, JP-B No. 2-16765, urethane compounds having an ethylene oxide skeleton mentioned in JP-B No. 58-49860, JP-B No. 56-17654, JP-B No. 62-39417, JP-B No. 62-39418 are also preferable.

Furthermore, radical-polymerizable compounds having amino structure and sulfide structure within a molecule mentioned in JP-A No. 63-277653, JP-A No. 63-260909, and JP-A No. 1-105238 may be employed.

As the other examples, polyfunctional acrylate and methacrylate such as polyester acrylates and epoxy acrylates obtained by reaction of an epoxy resin and (meth) acrylic acid as mentioned in JP-A No.48-64183, JP-B No.49-43191, and JP-B No.52-30490 are capable of being listed. Moreover, a specific unsaturated compound mentioned in JP-B No.46-43946, JP-B No. 1-40337, JP-B No. 1-40336 and vinyl sulfonic acid compound mentioned in JP-A No. 2-25493 and the like are capable of being listed. Moreover, in some cases, a structure containing perfluoroalkyl group mentioned in JP-A No.61-22048 is preferably used. Furthermore, compound which has been introduced as photo-curing monomer and oligomer in Journal of Japanese Adhesion Association Vol. 20, No. 7, pp. 300–308 (1984) is also capable of being used.

As for radical-polymerizable compound, it may be either employed alone or in combination of two or more of them. A method of the use of these radical-polymerizable compounds in detail can be optionally set, for example, what a kind of structure is used, whether it is used separately or in combination, how much an amount of addition is, and so forth according to the performance design of the final recording material.

As for the mixing ratio of a radical-polymerizable compound in an image recording material, although a higher ratio is more advantageous in the viewpoint of sensitivity, in the case where the ratio of the radical-polymerizable compound is excessively high, problems such as undesirable phase separation, problems concerning with the manufacturing processes because of the adhesiveness of an image recording layer (e.g., transfer of a recording layer component, manufacturing deficiencies due to the adhesiveness), a precipitation generated from a developing solution and the like may be occurred. From the points of view of these, the preferable ratio of the radical-polymerizable compound is, in the many cases, 5–80% by weight with respect to the all of the components, and preferably 20–75% by weight.

As to a method of using a radical-polymerizable compound, appropriate structure, mixing and an amount of addition can be optionally selected corresponding to the desired property, and further in some cases, a structure of layers and a method of coating such as under coat and topcoat can be also carried out.

[(C) Light-to-Heat Converting Agents]

As for an image recording material of the present invention, the use of a light-to-heat converting agent is essential since the recording is carried out by heat mode exposure, typically, laser emitting infrared rays. The light-to-heat converting agent has a function to absorb the light having the predetermined wavelength and converts the absorbed light to heat. Due to the heat generated at this moment, that is to say, due to the heat mode exposure to the light of wavelength which (D) components, namely, this (C) light-to-heat converting agent can absorb, the compound for generating a radical is decomposed, and a radical is generated. As to the light-to-heat converting agent used in the present invention, the light-to heat converting agent of the present invention may have a function of converting the absorbed light to heat, in general, a dye or a pigment which is known as, what is called, an infrared absorbent having the absorbing peak at the wavelengths of 760 nm–1200 nm, namely, the wavelength of an infrared laser used for writing is listed.

As dyes which are suitable for use, commercially available dyes such as the known dyes mentioned in the literatures of "Handbook of Dyes" edited by The Society of Synthetic Organic Chemistry, Japan (1970) can be utilized. Concretely, azo dye, azo dye of metal complex salt, pyrazolone azo dye, naphthoquinone dye, anthraquinone dye, phthalocyanine dye, carbonium dye, quinonimine dye, methine dye, cyanine dye, squarylium dye, pyrylium salt, and metal thiolate complex are listed.

As preferable dyes, for example, cyanine dyes mentioned in JP-A No.58-125246, JP-A No. 59-84356, JP-A No.59-202829, JP-A No.60-78787 and so forth, methine dyes mentioned in JP-A No.58-173696, JP-A No.58-181690, JP-A No.58-194595 and so forth, naphthoquinone dyes mentioned in JP-A No.58-112793, JP-A No.58-224793, JP-A No.59-48187, JP-A No.59-73996, JP-A No.60-52940, JP-A No.60-63744 and so forth, squarylium dyes mentioned in JP-A No.58-112792 and so forth and cyanine dyes mentioned in GB Patent No. 434,875 and so forth can be listed.

Moreover, a near infrared absorbing sensitizer mentioned in U.S. Pat. No. 5,156,938 is preferably employed, and a substituted arylbenzo (thio) pyrylium salt mentioned in U.S. Pat. No. 3,881,924, a trimethinethiapyrylium salt mentioned in JP-A No.57-142645 (U.S. Pat. No. 4,327,169), a pyrylium based compound mentioned in JP-A No.58-181051, 58-220143, 59-41363, 59-84248, 59-84248, 59-84249, 59-146063, 59-146061, a cyanine pigment mentioned in JP-A No.59-216146, a pentamethinethiopyrylium salt mentioned in U.S. Pat. No. 4,283,475 and so forth, pyrylium compounds disclosed in JP-B No. 5-13514 and 5-19702 are also preferably employed.

Moreover, as another example of the preferred dye, a near infrared absorbing dye mentioned in the specification of U.S. Pat. No. 4,756,993, as the formula (I) and (II) can be listed.

As the particularly preferred dyes among these dyes, a cyanine pigment, squarylium pigment, pyrylium salt, and nickel thiolate complex are listed. Further, a cyanine pigment is preferred, particularly, the cyanine pigment represented by the following general formula (58) is the most preferable one.

General formula (58)

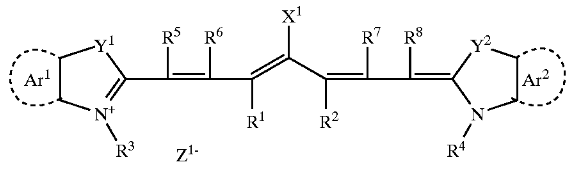

In the general formula (58), $X^1$ represents a halogen atom or $X^2$-$L^1$, wherein $X^2$ represents an oxygen atom or a sulfur atom; $L^1$ represents hydrocarbon group having 1–12 carbon atoms; $R^1$ and $R^2$ each independently represent a hydrocarbon group having 1–12 carbon atoms. In consideration of conservative stability of photosensitive layer coating liquid, $R^1$ and $R^2$ are preferably a hydrocarbon group having two or more carbon atoms, and further, it is particularly preferable that $R^1$ and $R^2$ bind each other and forms five-membered ring or six-membered ring.

$Ar^1$ and $Ar^2$ may be the same or different, respectively, and each of them represents an aromatic hydrocarbon group which may have a substituent. As the preferred aromatic hydrocarbon groups, a benzene ring and a naphthalene ring are listed. Moreover, as the preferable substituents, a hydrocarbon group having 12 or less carbon atoms, a halogen atom and an alkoxy group having 12 or less carbon atoms are listed. $Y^1$ and $Y^2$ may be the same or different, respectively, and each of them represents a sulfur atom or a dialkylmethylene group having 12 or less carbon atoms. $R^3$ and $R^4$ may be the same or different, respectively, and each of them represents a hydrocarbon group having 20 carbon atoms which may have a substituent. As the preferred substituents, an alkoxy group, a carboxyl group and a sulfo group having 12 or less carbon atoms are listed. $R^5$, $R^6$, $R^7$ and $R^8$ may be the same or different, respectively, and each of them represents a hydrogen atom or a hydrocarbon group having 12 or less carbon atoms. In consideration of availability for raw materials, preferably it is a hydrogen atom. Moreover, $Z^{1-}$ represents a counter anion. Provided that sulfo group is replaced with any one of $R^1$–$R^8$, $Z^{1-}$ is not needed. The preferred $Z^{1-}$ is a halogen ion, a perchlorate ion, tetrafluoroborate ion, hexafluorophosphate ion and sulfonate ion, and the particularly preferred are perchlorate ion, a hexafluorophosphate ion and an arylsulfonate ion from the viewpoint of conservation stability of photosensitive layer coating liquid.

As specific examples of cyanine pigment represented by the general formula (58), which are preferably capable of being used in the present invention, cyanine pigment mentioned in the description from the number of paragraph [0017] to the number of paragraph [0019] of the specification of Japanese Patent Application No. 11-310623 can be listed.

As the pigments used in the present invention, pigments commercially available and pigments mentioned in "Handbook of Color Indexes (C. I.)", "Latest pigment Handbook" edited by Japanese Pigment Technologies Association, 1977 "Latest Pigment Application Technologies" CMC Publishing Company, 1986 and "Printing Ink Technologies" CMC Publishing Company, 1984, can be utilized.

As kinds of pigments, a black color pigment, a yellow color pigment, an orange color pigment, a brown color pigment, a red color pigment, a purple color pigment, a blue color pigment, a green color pigment, a fluorescent pigment, a metal powder pigment, and besides these, a polymer bond dye are listed. Specifically, an insoluble azo pigment, an azo lake pigment, a condensed azo pigment, a chelated azo pigment, a phtalocyanine pigment, an antraquinone based pigment, a perylene and perynone pigment, a thio indigo based pigment, a quinacridone pigment, dioxazine based pigment, an isoindolinone based pigment, a quinophthalone based pigment, a dyed lake pigment, an azine pigment, a nitroso pigment, a nitro pigment, a natural pigment, a fluorescent pigment, an inorganic pigment, carbon black and the like can be used. The preferred pigment among these pigments is a carbon black.

These pigments may be either employed without performing any surface treatment or with performing surface treatment. As methods of surface treatment, a method of coating the surface of resin or wax, a method of attaching a surfactant, a method in which a reactive substance (e.g., a silane coupling agent, an epoxy compound, a polyisocyanate and the like) is bonded to the surface of the pigment and the like are considered. The above described method of surface treatment is mentioned in "Properties and Applications of Metal Soaps" (Sachi Shobo Co., Ltd.), "Printing Ink Technologies", CMC Publishing Co., Ltd., 1984, and "Latest Pigment Application Technologies", CMC Publishing Co., Ltd., 1984.

The diameter of particle of a pigment is preferably in the range of 0.01 μm–10 μm, more preferably in the range of 0.05 μm–1 μm, particularly preferred in the range of 0.1 μm–1 μm. In the case where the diameter of particle of a pigment is less than 0.01 μm, it is not desirable in the viewpoint of the stability of the dispersing material in an image photosensitive layer coating liquid, and in the case where the diameter is exceeded over 10 μm, it is not desirable in the viewpoint of the uniformity of the image photosensitive layer.

As a method of dispersing a pigment, the known dispersing technology employed for ink manufacturing and toner manufacturing can be used. As a dispersing apparatus, a ultrasonic disperser, a sand mill, an attritor, a pearl mill, a super mill, a ball mill, an impeller, a disperser, a KD mill, a colloid mill a dynatron, a three roller mill, a pressurized kneader and the like are listed. The description in detail is mentioned in "Latest Pigment Application Technologies", CMC Publishing Co., Ltd., 1986.

These light-to-heat converting agents may be either added to the same layer with the other components or added to another layer which has been provided, however, it is preferable that optical density at the absorption peak in the range of 760 nm–1200 nm of a wavelength of a photosensitive layer is between 0.1–3.0 upon preparing a negative-type image formation material. In the case where the optical density is out of this range, the sensitivity tends to be lowered. Since the optical density is determined by an addition amount of the foregoing light-to-heat converting agent and the thickness of the recording layer, a predetermined optical density is obtained by controlling the conditions of the both factors. The optical density of the recording layer can be measured by the conventional routine method. As a measuring method, for example, a method in which an amount of coating after drying which forms a recording layer having a thickness appropriately determined in the range required as a planographic plate on the transparent or white substrate is measured by a transparent-type optical densitometer, a method in which the recording layer formed on the reflective substrate of aluminum and the like is measured with respect to the measured reflected density, and so force are listed.

[(D) Compound Generating a Radical by Heat Mode Exposure to the Light of a Wavelength which (C) Light-to-Heat Converting Agent can Absorb]

A compound which generates a radical by heat mode exposure (hereinafter, appropriately referred to as a radical initiating agent) is a compound which is employed in combination with the foregoing (C) light-to-heat converting agent, which generates a radical by the light of wavelength which can be absorbed by the light-to-heat converting agent, for example, light, heat or the energy of the both of them generated at the time of infrared laser irradiation, and which initiates and promotes polymerization of (B) a radical-polymerizable compound having a polymeric unsaturated, wherein the term "heat mode exposure" is defined in accordance with the definition in the aforementioned present invention.

As a radical initiator, the agents such as the known photopolymerization initiator, thermal polymerization initiator and the like can be selected and used, for example, an onium salt, a triazine compound having a trihalomethyl group, a peroxide, azo based polymerization initiator, an azide compound, quinone azide and the like are listed, however, an onium salt has high sensitivity and is therefore preferable.

Onium salt which is preferably capable of being used as a radical initiator in the present invention will be described below. As the preferable onium salts, iodonium salt, diazonium salt and sulfonium salt are listed. In the present invention, these onium salts function as initiators of a radical polymerization but not as acid generating agents. Onium salts suitably used in the present invention are onium salts represented by the following general formula (59)–(61).

General formula (59)

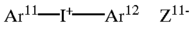

General formula (60)

General formula (61)

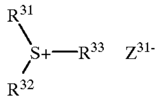

In the formula (59), $Ar^{11}$ and $Ar^{12}$ each independently represent an aryl group having 20 or less carbon atoms, and which may have a substituent. As the preferred substituents in the case where the aryl group has a substituent, a halogen atom, nitro group, alkyl group having 12 or less carbon atoms, alkoxy group having 12 or less carbon atoms, or aryloxy group having 12 or less carbon atoms is listed. $Z^{11-}$ represents a counter ion selected from a group consisted of a halogen ion, a peroxide ion, tetrafluoroborate ion, hexafluorophosphate ion, and sulfonate ion, and preferably a peroxide ion, hexafluorophosphate ion, and arylsulfonate ion.

In the formula (60), $Ar^{21}$ represents an aryl group having 20 or less carbon atoms which may have a substituent. As the preferable substituent, a halogen atom, nitro group, alkyl group having 12 or less carbon atoms, alkoxy group having 12 or less carbon atoms, aryloxy group having 12 or less carbon atoms, alkylamino group having 12 or less carbon atoms, dialkylamino group having 12 or less carbon atoms, arylamino group having 12 or less carbon atoms, or diarylamino group having 12 or less carbon atoms is listed. $Z^{21-}$ represents the counter ion which has the same meaning as $Z^{11-}$.

In the formula (61), $R^{31}$, $R^{32}$ and $R^{33}$ may be the same or different, respectively and represent a hydrocarbon group having 20 or less carbon atoms which may have a substituent. As the preferable substituents, a halogen atom, nitro group, alkyl group having 12 or less carbon atoms, alkoxy group having 12 or less carbon atoms, or aryloxy group having 12 or less carbon atoms is listed. $Z^{31-}$ represents the counter ion which has the same meaning as $Z^{11-}$.

In the present invention, as onium salt which is preferably capable of being used as a radical generator, the generator mentioned from the number of paragraph [0030] to the number of paragraph [0033] of the specification of Japanese Patent Application No. 11-310623 is capable of being listed.

Moreover, the onium salt represented by the general formula (I)–(IV) mentioned from the number of paragraph [0012] to the number of paragraph [0050] of JP-A No. 11-34110, a known polymerization initiator such as a thermal polymerization initiator mentioned in the number of paragraph [0016] of JP-A No. 8-108621 and so force are also preferably employed.

As for a radical initiator employed in the present invention, its peak absorption wavelength is preferably 400 nm or less, and further, more preferably 360 nm or less. In this way, by setting absorption wavelength in the range of ultraviolet region, the manipulation of an image recording material can be carried out under the incandescent lamp.

[Other Components]

Various compounds except these may be further added to an image recording material according to the necessity. For example, a dye having a large absorption property in a visible light range can be used as a coloring agent of an image. Namely, Oil Yellow #101, Oil Yellow #103, Oil Pink # 312, Oil Green BG, Oil Blue BOS, Oil Blue # 603, Oil Black BY, Oil Black BS, Oil Black T-505 (the above; products made by Orient Chemical Industries, Co., Ltd.), Victoria Pure Blue, Crystal Violet (C. I. 42555), Methyl Violet (C. I. 42535), Ethyl Violet, Rhodamine B (C.I. 145170B), Malachite Green (C. I. 42000), Methylene Blue (C. I. 52015) and the dyes mentioned in JP-A No.62-293247 and the like are capable of being listed. Moreover, a phthalocyanine based pigment, an azo based pigment, a carbon black, a titanium oxide and the like are preferably capable of being employed.

Since these coloring agents can be easily distinguished between an image portion and non-image portion after the formation of an image, the addition of these coloring agents is preferable. It should be noted that the ratio of an amount of addition is 0.01–10% by weight to the total solids content of photosensitive layer coating liquid.

Moreover, in the present invention, it is desirable to add a slight amount of a thermal polymerization inhibitor in order to inhibit the unnecessary thermal polymerization of the image recording material while the image recording material is prepared or conserved. As suitable thermal polymerization inhibitors, hydroquinone, p-methoxyphenol, di-t-butyl-p cresol, pyrogallol, t-butylcatechol, benzoquinone, 4,4'-thio bis(3-methyl-6-t-butylphenol), 2,2'-methylene bis (4-methyl-6-t-butylphenol), N-nitroso-N-phenylhydroxylamine aluminium salt and the like are listed. The ratio of an amount of addition of a thermal polymerization inhibitor is preferably about 0.01% by weight–about 5% by weight to the total weight of the entire components. Moreover, it will be also good that a high grade fatty acid derivative such as behenic acid and behenic amide and so forth are added in order to prevent the polymerization inhibition due to oxygen according to the necessity and localized on the surface of the photosensitive layer in the drying process following the coating process. The ratio of an amount of addition of a high grade fatty acid derivative is preferably about 0.1% by weight–about 10% by weight of the total components.

Moreover, an image recording material in the present invention is used for forming an image recording layer of the planographic original plate, however, a nonionic surfactant as mentioned in JP-A No.62-251740 and JP-A No. 3-208514 and an ampholytic surfactant as mentioned in JP-A No.59-121044, JP-A No. 4-13149 are capable of being added in order to widen the stability of the treatment with respect to the developing conditions of those image recording layer.

As specific examples of nonionic surfactants, sorbitan tristearate, sorbitan monopalmitate, sorbitan trioleate, stearyl monoglyceride and polyoxyethylene nonylphenyl ether and the like are listed.

As specific examples of ampholytic surfactants, alkyldi (aminoethyl) glycine, alkylpolyaminoethyl glycine hydrochloride, 2-alkyl-N-carboxyethyl-N-hydroxyethyl imidazolinium betaine, N-tetradecyl-N,N-betaine type (e.g., trade name, Amogen K, made by Dai-ichi Industries, Co., Ltd.) and the like are listed.

The ratio occupied by the above-described nonionic surfactant and ampholytic surfactant in the photosensitive layer coating liquid is preferably 0.05–15% by weight, and more preferably 0.1–5% by weight.

Furthermore, in a photosensitive layer coating liquid of the present invention, a plasticizer is added in order to give the flexibility of a coating film according to the necessity. For example, polyethylene glycol, tributyl citrate, diethyl phthalate, dibutyl phthalate, dihexyl phthalate, dioctyl phthalate, tricresyl phosphate, tributyl phosphate, trioctyl phosphate and tetrahydrofurfuryl oleate and the like are employed.

In order to manufacture the planographic original plate using an image recording material of the present invention, it will be sufficient that constituent components of an image recording material is normally dissolved in a solvent with respective components necessary for the coating liquid and is coated on a suitable substrate. As solvents used here, ethylenedichloride, cyclohexanone, methylethylketone, methanol, ethanol, propanol, ethylene glycol monomethylether, 1-methoxy-2-propanol, 2-methoxy ethylacetate, 1-methoxy-2-propylacetate, dimethoxyethane, methyl lactate, ethyl lactate, N,N-dimethylacetamide, N,N-dimethylformamide, tetramethylurea, N p methylpyrrolidone, dimethylsulfoxide, sulfolane, γ-butyrolactone, toluene, water and the like are capable of being listed, however, not limited to these. These solvents are used separately or by blending two of them or more into a mixture. The concentration of the above-described components in a solvent (the total solids content including additives) is preferably 1–50% by weight.

Moreover, although an amount of coating (solids content) of an image recording layer on an substrate following coating and drying processes is different depending upon the use, as to the planographic original plate, in general, it is preferable to be 0.5–5.0 $g/m^2$. As methods of coating, although a variety of methods are capable of being employed, for example, bar coating, rotational coating, spraying, curtain coating, dipping, air-knife coating, blade coating, rolling coating and the like are capable of being listed. As an amount of coating is decreased, the apparent sensitivity becomes higher, however, the coating property of an image recording layer becomes lower.

A surfactant for making coating property better, for example, fluorinated surfactant as mentioned in JP-A No.62-170950 can be added to an image recording layer coating liquid of the present invention. The preferable rate of an amount of addition of this is 0.01–1% by weight of solids content of the total photosensitive layer materials, and more preferably is 0.05–0.5% by weight.

(Protective Layer)

When the planographic original plate of the present invention is used, since normally exposure is carried out in the air, it is preferable to further provide a protective layer on an image recording layer containing photopolymeric components. The properties desired for such a protective layer are defined so that the permeability of low molecular compounds such as oxygen and the like is low, the permeability of the light used for exposure is good, the adhesion with the recording layer is excellent and the removal of it can be easily performed in the developing process following the exposure. In general, polymeric compound soluble in water and having comparatively excellent crystallinity such as polyvinylalcohol, polyvinylpyrrolidone, acidic celluloses, gelatin, gum Arabic, polyacrylic acid are employed.

In an image recording material of the present invention, since the aforementioned specific polyurethane resin characterized in that an amount of dissolved oxygen in the film after coating film formation is low and further oxygen isolation tendency from the external is high is employed as a coating formation resin and has an advantage that lowering of an image formation property due to polymerization inhibition by oxygen and the like can be suppressed, it is not necessarily provided with such a protective layer, however, for the purpose of further enhancing oxygen isolation tendency from the external and an image formation property, especially an image intensity, the aforementioned protective layer may be provided.

(Supporting Body)

As a substrate used in the case where the planographic original plate is formed by employing an image recording material of the present invention, there are not particular limitations if it is in a dimensionally stable plate form, for example, a paper, a plastic (e.g., polyethylene, polypropylene, polystyrene and the like)-laminated paper, a metal plate (e.g., aluminum, zinc, copper and the like), a plastic film (e. g., diacetylcellulose, triacetylcellulose, cellulose propionate, cellulose butyrate, cellulose butyrate acetate, cellulose nitrate, polyethylene terephthalate, polyethylene, polystyrene, polypropylene, polycarbonate, polyvinyl acetal and the like) and the like are listed. It may be either a sheet of a single component such as resin film, metal plate or the like, or laminated sheets made of two or more kinds of materials, and for example, it includes a paper, plastic film on which the metal as mentioned is laminated or deposited, a laminated sheet made of different kinds of plastic films and the like.

As the aforementioned substrate, a polyester film or an aluminum plate is preferable, and an aluminum plate is particularly preferable out of them, which is dimensionally stable. The preferable aluminum plate is an alloy plate which is mainly made of pure aluminum plate and aluminum and which contains a trace of the other element or further it may be a plastic film on which aluminum is laminated or deposited. The other elements contained in aluminum alloy include silicon, iron, manganese, copper, magnesium, chromium, zinc, bismuth, nickel, titanium and the like. The maximum content of the other elements in an alloy is 10% by weight at most. Although particularly preferable aluminum in the present invention is pure aluminum, since it is difficult to manufacture the perfectly pure aluminum in terms of refining technology, it will be also available even if aluminum contains a trace of the other element. In this way, since the components of an aluminum plate applied to the present invention are not specified and defined, an aluminum plate which is conventionally known and used is capable of being appropriately utilized.

The thickness of the aforementioned aluminum plate is approximately on the order of 0.1–0.6 mm, preferably 0.15–0.4 mm, and in particular, preferably 0.2–0.3 mm.

Prior to the roughening of the surface of an aluminum plate, depending upon the desired request, a degreasing treatment is carried out by, for example, a surfactant, an organic solvent, an aqueous alkaline solution and the like for the purpose of removing a rolling oil from the surface of the aluminum plate.

Although the roughening of the surface of an aluminum plate is carried out by a variety of methods, for example, a method in which the roughening is carried out by mechanical roughening, a method of electrochemically dissolving the surface, and a method of selectively dissolving the surface in a chemical manner. As mechanical methods, the known methods such as a method of polishing using a ball, a method of polishing using a brush, a method of polishing by blasting, a method of polishing by buffing and the like are capable of being employed. Moreover, as a method of electrochemically roughening, there are methods by which the roughening is carried out in hydrochloric acid or nitric acid electrolyte solution using alternative current or direct current. Moreover, a method of combining the both methods as disclosed in JP-A No.54-63902 gazette is also capable of being utilized.

An aluminum plate whose surface is roughened in this way, depending upon the desired request, can be submitted to an anodic oxidation treatment via an alkaline etching treatment and a neutralizing treatment in order to enhance the properties of water retention and wear resistance of the surface. As electrolytes used for anodic oxidation treatment of an aluminum plate, various kinds of electrolytes forming a porous oxidation coating is capable of being utilized, in general, sulfuric acid, phosphoric acid, oxalic acid, chromic acid or a mixture of these acids is used as the electrolyte. The concentration of these electrolytes are appropriately determined depending upon the kinds of electrolytes.

Since the conditions of an anodic oxidation treatment are variously changed depending upon the electrolytes employed, the conditions cannot be specified in general, however, generally, if the concentration of an electrolyte is in the range of 1–80% by weight in solution, the temperature of the liquid is in the range of 5–70° C., the current density is in the range of 5–60 A/dm$^2$, the voltage is in the range of 1–100 V, and the electrolyte time is in the range of 10 sec–5 minutes, it can be said that the conditions are proper.

As for an amount of anodic oxidation coating, it is preferable that it is 1.0 g/m$^2$ or more, more preferably in the range of 2.0–6.0 g/ m$^2$. In the case where the amount of an anodic oxidation coating is less than 1.0 g/m$^2$, the plate life is not sufficient, or a non-image portion of the planographic plate is easily scratched, and what is called a "scratched smudge" phenomenon in which ink is attached on the portion of the relevant scratched flaw during the printing is easily occurred.

It should be noted that such an anodic oxidation treatment is provided on the right face of the substrate of a planographic plate, however, in general, on the reverse face, an anodic oxidation coating is also formed with an amount of 0.01–3 g/m$^2$ due to the running of an electric power line on the reverse face.

The hydrophilic treatment for the surface of the substrate is provided following the above-described anodic oxidation treatment, and the conventionally known methods are employed. As such hydrophilic treatments, a method of alkaline metal silicate (e.g., sodium silicate solution and the like) as disclosed in U.S. Pat. Nos. 2,714,066; 3,181,461; 3,280,734 and 3,902,734. In this method, the substrate is soaked in an aqueous solution of sodium silicate or electrolytically treated. The other methods such as a method of treating with potassium fluorozirconate disclosed in JP-B No.36-22063, and a method of treating with polyvinyl phosphonic acid as disclosed in U.S. Pat. Nos. 3,276,868; 4,153,461; 4,689,272, and so forth are employed.

Among these, the particularly preferable method of hydrophilic treatment in the present invention is a method of treating with silicate. The method of treating with silicate will be described below.

The anodic oxidation coating of an aluminum plate treated as described above is immersed in an aqueous solution in which alkaline metal silicate is 0.1–30% by weight, preferably 0.5–10% by weight to the solution where pH is in the range of 10–13 at 25° C., for example, for 0.5–120 sec at 15–80 ° C. If the pH of aqueous solution of alkaline metal silicate is lower than 10, the liquid is gelled, and if the pH is higher than 13.0, anodic oxidation film is dissolved. As an alkaline metal silicate used in the present invention, sodium silicate, potassium silicate, lithium silicate and the like are used. As hydroxide used for increasing the pH of aqueous solution of alkaline metal silicate, sodium hydroxide, potassium hydroxide, lithium hydroxide and the like are listed. It should be noted that it will be also available to blend an alkaline earth metal salt or a group IVB metal salt in the above-described treatment liquid. As alkaline earth metal salts, water soluble salts such as nitrates e.g., calcium nitrate, strontium nitrate, magnesium nitrate and barium nitrate, sulfate, chlorides, phosphates, acetates, oxalates, and borates are listed. As the salts of group IVB metals, titanium tetrachloride, titanium trichloride, potassium titanium fluoride, potassium titanium oxalate, titanium sulfate, titanium tetraiodide, zirconium chloride oxide, zirconium dioxide, zirconium oxychloride, zirconium tetrachloride and the like are listed. Alkaline earth metal salts or group IVB metal salts are capable of being used singly or in combination of two or more. The preferred rate of these metal salts is in the range of 0.01–10% by weight, and more preferably in the range of 0.05–5.0% by weight.

Since hydrophilicity of the surface of an aluminum plate is further improved owing to the silicate treatment, at the time of printing, ink is not easily attached on a non-image portion, and the smudge performance is enhanced.

A back coat is provided on the reverse face of the substrate according to the necessity. As such back coats, an organic macromolecular compound mentioned in JP-A No. 5-45885, and coating layer consisted of metal oxide obtained by hydrolyzing and polycondensing an organic or inorganic metal compound mentioned in JP-A No. 6-35174 are preferably used.

Among these coating layers, alkoxy compounds of silicon such as $Si(OCH_3)_4$, $Si(OC_2H_5)_4$, $Si(OC_3H_7)_4$, $Si(OC_4H_9)_4$ are inexpensive and easily obtainable, the coating layer of metal oxide given by these is excellent in development durability, and it is particularly preferable.

In this way, as described above, the planographic original plate is capable of being prepared by an image recording material of the present invention. The planographic original plate is capable of being recorded using an infrared laser.

Moreover, the thermal recording using ultraviolet lamp and/or thermal head can be performed. In the present invention, it is preferable to be image-exposed by a solid state laser and a semiconductor laser which irradiate infrared rays in the range of the wavelength of 760 nm–1,200 nm.

After subjected to exposure by an infrared laser, an image recording material of the present invention is preferably developed with water or aqueous alkaline solution.

In the case where aqueous alkaline solution is employed as a developing solution, as a developing solution and replenishment solution, the conventionally known aqueous alkaline solutions are capable of being used. For example, the aqueous solutions of inorganic alkaline salts such as sodium silicate, potassium silicate, sodium tertiary phosphate, potassium tertiary phosphate, ammonium tertiary phosphate, sodium secondary phosphate, potassium secondary phosphate, ammonium secondary phosphate, sodium carbonate, potassium carbonate, ammonium carbonate, sodium hydrogencarbonate, potassium hydrogencarbonate, ammonium hydrogencarbonate, sodium borate, potassium borate, ammonium borate, sodium hydroxide, ammonium hydroxide, potassium hydroxide, lithium hydroxide or the like is listed. In addition, the organic alkaline agents such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropylamine, diisopropylamine, ethyleneimine, ethylenediamine, pyridine and the like are also employed.

These alkaline agents are used separately or in combination of two or more.

Furthermore, in the case where development is performed by an automatic developer, it is known that a large amount of the planographic original plate can be treated by adding the same solution as the developing solution or aqueous solution (replenishment solution) whose intensity of alkaline is higher than that of the developing solution to the developing solution without changing the developing solution in the developing tank for a long time. This replenishment method is also preferably applied to the present invention.

A variety of surfactants, organic solvents and the like can be added according to the necessity for the purpose of promoting and suppressing the developing ability, dispersing the developing stain and enhancing the ink-philicity of the image portion of a printing plate. As the preferable surfactants, an anionic surfactant, a cationic surfactant, a non-ionic surfactant and an ampholytic surfactant are listed. As the preferred organic solvents, benzyl alcohol or the like is listed. Moreover, the addition of polyethylene glycol or derivatives thereof, or polypropylene glycol or derivatives thereof and so on are also preferable. Moreover, non-reducing sugars such as arabitol, sorbitol, mannitol, and the like are also capable of being added.

Moreover, hydroquinone, resorcin, inorganic salt based reducing agents such as sodium or potassium sulfite or hydrogensulfite, an organic carboxylic acid, defoaming agent, and a water softener are capable of being added.

The printing plate development-treated using the above-described developing solution and replenishment solution is post-treated with rinsing liquid containing washing water, a surfactant and the like, and a desensitized fatty solution containing gum arabic or a starch derivative. As for the purpose of a post-treatment in the case where an image recording material of the present invention is used as a plate material for printing, a variety of combinations of these treatments are capable of being used.

In recent years, in the fields of plate making industry and printing industry, an automatic developer for a plate material for printing is widely used for the sake of rationalization and standardization of the plate making processes. In general, an automatic developer is generally consisted of a developing section and post-treatment section, and consisted of a device for transferring plate materials for printing and the respective treatment solution tanks and a spraying device, while the printing plate already exposed is transferred in a horizontal direction, the respective treatment solution pumped by a pump is sprayed from spraying nozzles and development-treated. Moreover, recently, it is known that a method of treating a plate material for printing being immersed and transferred by in-liquid guide roller and the like in the treatment liquid filled treatment liquid tank. In such automatic treatments, the treatments is capable of being carried out while filling the replenishment solution corresponding to the amount of treatment, working time and the like. Moreover, the electrical conductivity is sensed by a sensor and the replenishment solution is also capable of being automatically filled.

Moreover, what is called a disposable treatment method of substantially treating by unused treatment solution is also capable of being applied.

The planographic plate obtained as described above, depending upon the desired request, after coating a desensitized fatty gum, is capable of being provided in the printing process, however, if a planographic plate having still longer plate life is desired, a burning treatment is provided.

In the case where a planographic plate is burned, a treatment is preferably carried out by a surface regulating liquid as mentioned in JP-B No.61-2518; 55-28062; JP-A No.62-31859; 61-159655, prior to the burning process.

As a method of carrying out the treatment, a method of coating a surface regulating liquid on the planographic plate using a sponge or absorbent cotton soaked with the relevant surface regulating liquid or a method in which the printing plate is immersed and coated in a vat filled with the surface regulating liquid, a method of coating the surface regulating liquid by an automatic coater are applied. Moreover, the better results will be given if the amount of coating is flattened by a squeezing apparatus or a squeezing roller after coating.

As to an amount of a surface regulating liquid, generally 0.03–0.8 $g/m^2$ (dry weight) is appropriate.

After drying, if it is required, the planographic plate on which a surface regulating liquid is coated is heated by a burning processor (e.g., burning processor: BP-1300; commercially available from Fuji Photograph Films, Co., Ltd.) and the like. In this case, the heating temperature and time period thereof are, although depending upon kinds of component forming an image, preferably in the range of 180–300° C. for 1–20 minutes.

The planographic plate burning-processed can be appropriately subjected to the conventionally performed treatments such as a washing using water, a gum coating treatment and the like according to the necessity, however, in the case where a surface regulating liquid containing water soluble polymeric compounds and the like has been used, the so-called desensitized treatments such as a gum coating treatment and the like are capable of being omitted.

The planographic plate obtained by an image recording material of the present invention is submitted to offset printing machine and the like, used for printing a large number of sheets due to such a treatment.

EXAMPLES

Hereinafter, although the present invention will be described further in detail by synthesis examples, examples and comparative examples, the present invention is not limited by these.

Synthesis Example 1

Polyurethane Resin 1

In a three-neck round bottom flask equipped with a condenser and a stirrer of 500 mL, 2,2-bis(hydroxymethyl) butyrate of 8.2 g (0.05 mole) and trimethylolpropanemonoarylether of 7.8 g (0.05 mole) were dissolved in N,N-dimethylacetamide of 100 mL. To this, 4,4-diphenylmethanediisocyanate of 20.0 g (0.08 mole), 1,6-hexamethylenediisocyanate of 3.4 g (0.02 mole) and dibutyltindilaurate of 0.1 g were added, heated and stirred for 8 hours at 100° C. Subsequently, it was diluted with N,N-dimethylformamide of 100 mL and methylalcohol of 200 mL. A reactive solution was madeup while stirring in water of 3 L, white polymer was separated out. The relevant polymer has been filtered off, after washing with water, an amount of 32 g of the polymer was obtained by drying it under vacuum.

As the molecular weight has been measured by gel permeation chromatography (GPC), the weight average molecular weight (polystyrene standard) was 110,000. Further, as the content of carboxyl group (acid value) was measured by titration, it was 1.33 meq/g.

Synthesis Example 2

Polyurethane Resin 21

2,2-bis(hydroxymethyl)propionic acid of 10.3 g (0.077 mole) and polypropylene glycol (weight average molecular weight) of 23.0 g (0.023 mole) were dissolved in N,N-dimethylacetamide of 100 mL. To this, 4,4'-diphenylmethanediisocyanate of 20.0 g (0.08 mole), hexamethylenediisocyanate of 3.4 g (0.02 mole) were added, reacted and post-treated similarly to the case of Synthesis example 1. An amount of 80 g of the polymer was obtained.

As the molecular weight has been measured by gel permeation chromatography (GPC), the weight average molecular weight (polystyrene standard) was 100,000. Moreover, as the content of a carboxyl group (acid value) was measured by titration, it was 1.35 meq/g.

Hereinafter, polyurethane resins (polyurethane resin 1-polyurethane resin 28) of the present invention were synthesized by employing a diisocyanate compound and a diol compound indicated in the following Table 1–Table 5 similarly to Synthesis example 1 or Synthesis example 2. Furthermore, the molecular weights were measured by GPC, and the acid values were measured by titration. The measured results are indicated in Table 1–Table 5.

TABLE 1

| Polyurethane resin | Used diisocyanate compound (mole %) | Used diol compound (mole %) | Weight average molecular weight | Acid value meq/g |
|---|---|---|---|---|
| 1 | 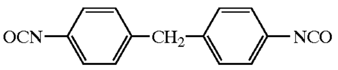 80; $OCN(CH_2)_6NCO$ 20 | 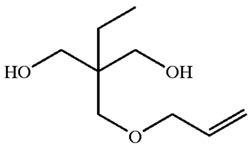 45; 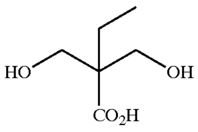 55 | 110,000 | 1.33 |
| 2 | 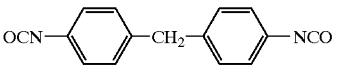 80; $OCN(CH_2)_6NCO$ 20 | $HO(CH_2)_4OH$ 60; 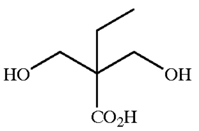 40 | 100,000 | 1.42 |
| 3 | 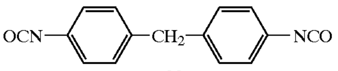 80; $OCN(CH_2)_6NCO$ 20 | $HO(CH_2CH_2O)_4OH$ 60; 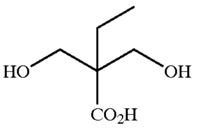 40 | 120,000 | 1.35 |
| 4 | 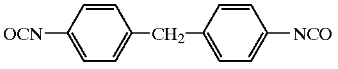 80; $OCN(CH_2)_6NCO$ 20 | 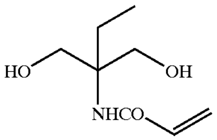 55; 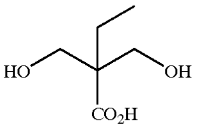 45 | 103,000 | 1.40 |

TABLE 1-continued

| Polyurethane resin | Used diisocyanate compound (mole %) | Used diol compound (mole %) | Weight average molecular weight | Acid value meq/g |
|---|---|---|---|---|
| 5 | 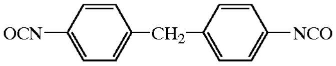 80 OCN$(CH_2)_6$NCO 20 | 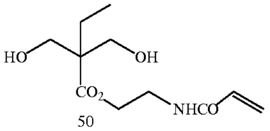 50 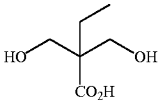 50 | 120,000 | 1.36 |
| 6 | 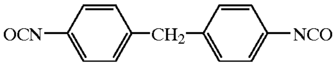 80 OCN$(CH_2)_6$NCO 20 | 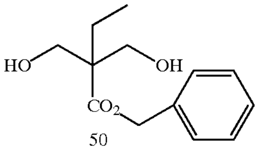 50 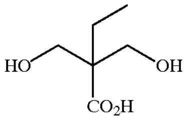 50 | 135,000 | 1.38 |

TABLE 2

| Polyurethane resin | Used diisocyanate compound (mole %) | Used diol compound (mole %) | Weight average molecular weight | Acid value meq/g |
|---|---|---|---|---|
| 7 | 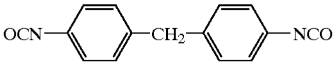 80 OCN$(CH_2)_6$NCO 20 | 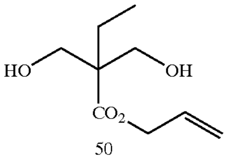 50 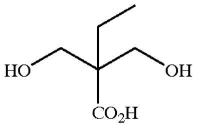 50 | 138,000 | 1.35 |
| 8 | 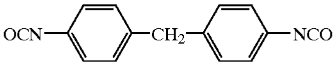 80 OCN$(CH_2)_6$NCO 20 | 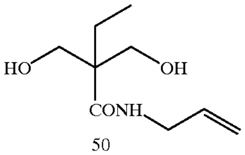 50 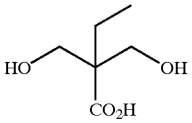 50 | 128,000 | 1.37 |
| 9 | 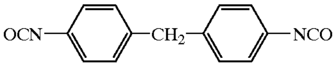 80 OCN$(CH_2)_6$NCO 20 | 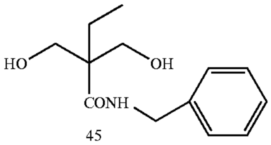 45 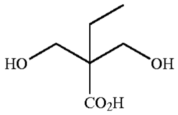 55 | 135,000 | 1.39 |
| 10 | 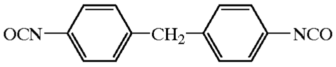 80 OCN$(CH_2)_6$NCO 20 | 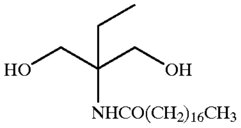 40 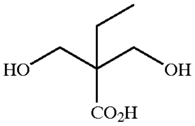 60 | 140,000 | 1.35 |
| 11 | 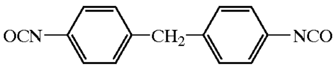 80 OCN$(CH_2)_6$NCO 20 | 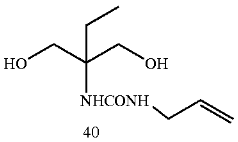 40 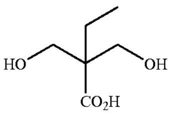 60 | 120,000 | 1.36 |

TABLE 2-continued
| Polyurethane resin | Used diisocyanate compound (mole %) | Used diol compound (mole %) | Weight average molecular weight | Acid value meq/g |
|---|---|---|---|---|
| 12 | 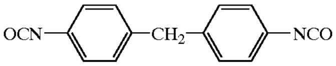 80; OCN($CH_2$)$_6$NCO 20 | 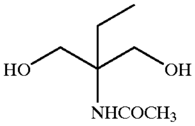 45; 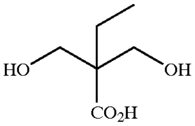 55 | 110,000 | 1.40 |
TABLE 3
| Polyurethane resin | Used diisocyanate compound (mole %) | Used diol compound (mole %) | Weight average molecular weight | Acid value meq/g |
|---|---|---|---|---|
| 13 | 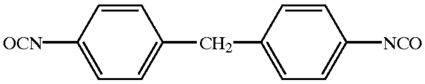 100 | 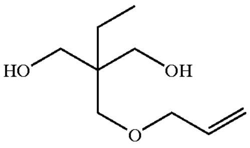 45; 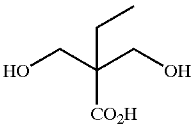 55 | 150,000 | 1.30 |
| 14 | 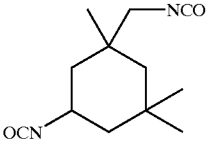 100 | HO($CH_2$)$_4$OH 70; 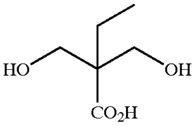 30 | 105,000 | 1.37 |
| 15 | 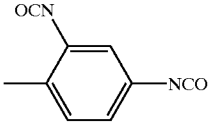 80; OCN($CH_2$)$_6$NCO 20 | HO($CH_2CH_2O$)$_4$OH 60; 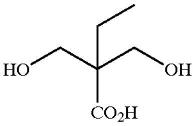 40 | 120,000 | 1.35 |
| 16 | 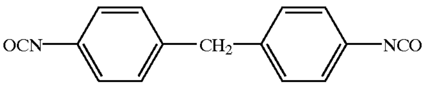 100 |  55; 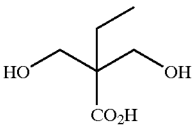 45 | 157,000 | 1.37 |
| 17 | 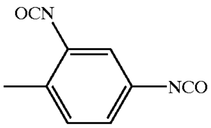 100 | 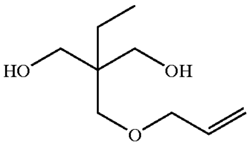 45; 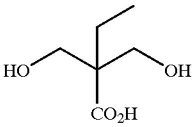 55 | 120,000 | 1.36 |

TABLE 3-continued
| Polyurethane resin | Used diisocyanate compound (mole %) | Used diol compound (mole %) | Weight average molecular weight | Acid value meq/g |
|---|---|---|---|---|
| 18 | 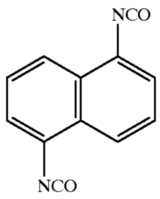 100 | 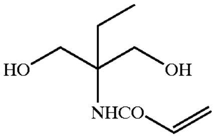 55 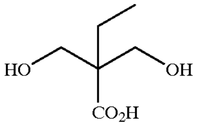 45 | 135,000 | 1.38 |
TABLE 4
| Polyurethane resin | Used diisocyanate compound (mole %) | Used diol compound (mole %) | Weight average molecular weight | Acid value meq/g |
|---|---|---|---|---|
| 19 | 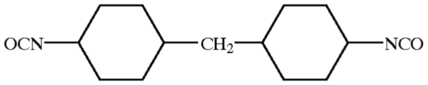 100 | 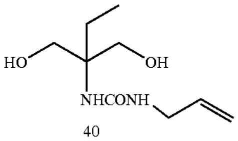 40 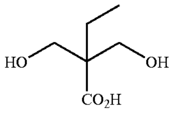 60 | 140,000 | 1.34 |
| 20 | 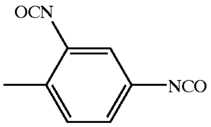 100 | 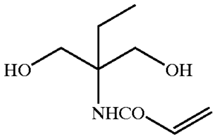 55 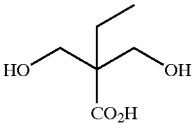 45 | 157,000 | 1.37 |
| 21 | 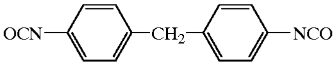 80 $OCN(CH_2)_6NCO$ 20 | 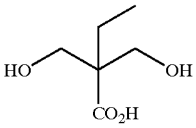 77 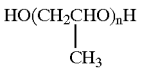 Mw1000 23 | 50,000 | 1.35 |
| 22 | 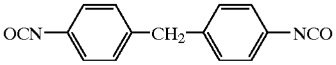 80 $OCN(CH_2)_6NCO$ 20 | 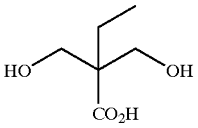 75 $HO(CH_2CH_2CH_2CH_2O)_nH$ Mw2000 25 | 99,000 | 1.20 |
| 23 | 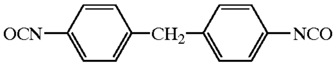 80 $OCN(CH_2)_6NCO$ 20 | 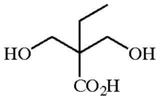 77 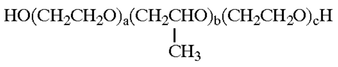 Mw1500 23 | 100,000 | 1.20 |

TABLE 4-continued
| Poly-ure-thane resin | Used diisocyanate compound (mole %) | Used diol compound (mole %) | Weight average molecular weight | Acid value meq/g |
|---|---|---|---|---|
| 24 | 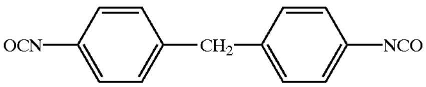 100 | 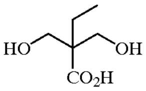 70 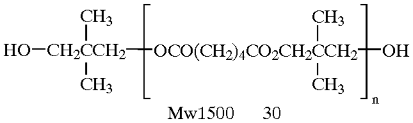 Mw1500 30 | 103,000 | 1.32 |

TABLE 5
| Polyurethane resin | Used diisocyanate compound (mole %) | Used diol compound (mole %) | Weight average molecular weight | Acid value meq/g |
|---|---|---|---|---|
| 25 | 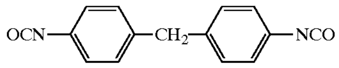 80 $OCN(CH_2)_6NCO$ 20 | 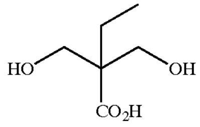 80 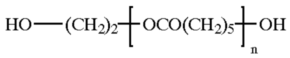 Mw1500 20 | 130,000 | 1.35 |
| 26 | 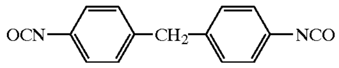 80 $OCN(CH_2)_6NCO$ 20 | 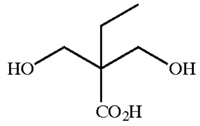 77 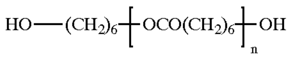 Mw2000 23 | 110,000 | 1.22 |
| 27 | 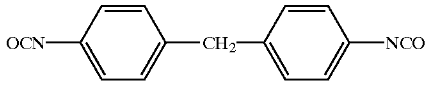 100 | 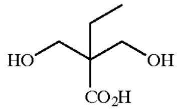 70 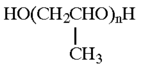 Mw1000 10 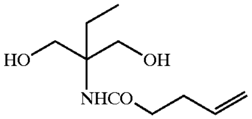 20 | 120,000 | 1.35 |
| 28 | 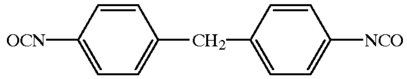 60 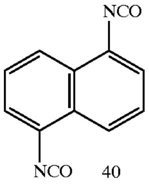 40 | 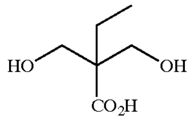 70 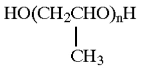 Mw1000 12 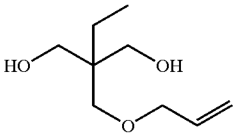 18 | 107,000 | 1.33 |

Examples 1–5, Comparative Example 1

[Preparation of Substrate]

Molten alloy of JIS A1050 alloy including aluminum of 99.5%, Fe 0.30%, Si 0.10%, Ti 0.02%, Cu 0.013% was purification-treated, and cast. In the purification treatment, degassing treatment was carried out in order to remove unnecessary gases such as hydrogen and the like in the molten alloy, ceramic tube filter treatment was performed. Casting is carried out by DC casting method. Solidified cast mass in a plate thickness of 500 mm was faced in a depth of 10 mm from the surface, the flattened treatment was carried out at 550° C. for 10 hours so that an intermetallic compound was not roughened. Next, after it was hot rolled at 400° C., intermediately annealed at 500° C. for 60 seconds in a sequential annealing furnace, cold rolling was carried out, and an aluminum rolled plate of plate pressure 0.30 mm was made. The central line average surface roughness Ra after cold rolling was controlled in 0.2 μm by controlling the roughness of the roll. Subsequently, it was submitted to a tension leveler in order to enhance the flatness.

Next, the surface treatment was carried out to be a substrate of the planographic plate.

First, in order to remove the rolling oil of the surface of aluminum plate, degreasing treatment was carried out at 50° C. for 30 seconds with 10% aqueous solution of aluminate soda, neutralized at 50° C. for 30 seconds with 30% aqueous solution of sulfuric acid, and smut removal treatment was carried out.

Next, in order to improve adhesion between the substrate and the recording layer and give the retention of water on the non-image portion, the so-called graining treatment which roughens the surface of the substrate was carried out. An aqueous solution containing 1% of nitride and 0.5% of nitride aluminum was maintained at 45° C., while aluminum web was flown in the aqueous solution, 240 C/dm$^2$ on the side of anode is given with current density 20 A/dm$^2$ and alternate waveform of duty ratio 1:1 using an indirect supplying power cell and electrolytic grain-up was carried out. Subsequently, etching treatment was carried out with aqueous solution of 10% aluminate soda at 50° C. for 30 seconds, neutralized at 50° C. for 30 seconds with 30% aqueous solution of sulfuric acid, and smut removal treatment was carried out.

Furthermore, in order to enhance abrasion resistance, agent resistance and retention of water, oxidation coating was formed on the substrate by anodic oxidation. Aqueous solution of 20% sulfuric acid is used as electrolyte at 35° C., while an aluminum web is transferred through the electrolyte, the electrolytic treatment was carried out by the DC current of 14 A/dm$^2$ using indirect supplying power cell, and an anodic oxidation coating of 2.5 g/m$^2$ was formed.

Subsequently, in order to secure the hydrophilicity as non-image portion of the printing plate, silicate treatment was carried out. In the treatment, aqueous solution of No. 3 silicate soda of 1.5% was maintained at 70° C., an aluminum web was transferred so that the contact time of the aluminum web was 15 seconds, and further washed with water. An amount of attachment of Si was 10 mg/m$^2$. The Ra (center line surface roughness) of the substrate prepared as described above was 0.25 μm.

[Formation of Photosensitive Layer]

The following photosensitive layer coating liquid (P-1) was prepared, coated on the aluminum substrate obtained in the way as described above by employing a wire bar, dried at 115° C. for 45 seconds in the hot wind mode drying device, the photosensitive layer was formed and the planographic plate was obtained. An amount of coating after drying was in the range of 1.2–1.3 g/m$^2$.

It should be noted that an alkali soluble resin used in Example is a specific polyurethane resin (A) obtained by the Synthesis example, an alkali soluble resin P-1 used in the Comparative Example is benzylmethacrylate/methacrylic acid copolymer (polymerization mole ratio=80/20, polymeric compound of weight average molecular weight 100, 000).

<Photosensitive layer coating liquid (P-1)>

| | |
|---|---|
| Alkali soluble resin | (compound indicated in Table 6, amount indicated in Table 6) |
| Dipentaerythritolhexaacrylate (B) | 1.00 g |
| Infrared rays absorbent agent "IR-6" (C) | 0.08 g |
| Iodonium salt "I-1" (D) | 0.30 g |
| Naphthalene sulfonic acid of Victoria Pure Blue | 0.04 g |
| Fluorinated surfactant (Megafac F-176, made by Dai Nippon Ink Chemical Industry, Co., Ltd.) | 0.01 g |
| Methylethylketone | 9.0 g |
| Methanol | 10.0 g |
| 1-methoxy-2-propanol | 8.0 g |

IR-6

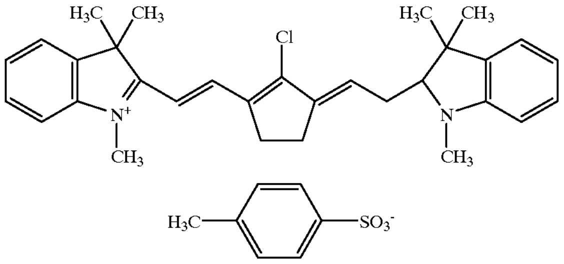

I-1

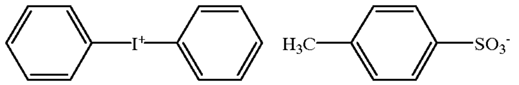

TABLE 6

| | Alkali soluble resin (content) | Presence or absence of ablation |
|---|---|---|
| Example 1 | Polyurethane resin 1 1.0 g | Absence |
| Example 2 | Polyurethane resin 2 1.0 g | Absence |
| Example 3 | Polyurethane resin 3 1.0 g | Absence |
| Example 4 | Polyurethane resin 21 1.0 g | Absence |
| Example 5 | Polyurethane resin 24 1.0 g | Absence |
| Comparative Example 1 | Polymer (P-1) 1.0 g | Presence |

[Exposure]

The above described respective planographic original plate obtained was exposed under the conditions of power 6.5 W, outer peripheral drum rotation count 81 rpm, plate face energy 188 mJ/cm$^2$, resolution 240 dpi by Trendsetter 3244 VFS made by Creo, Co., Ltd., mounting water cooling type 40W infrared semiconductor laser. After the exposure, the presence or absence of ablation on the plate was evaluated by visual inspection. The results were all written in Table 6.

As apparent in Table 6, the planographic plates of Examples employing an image recording material of the present invention as a photosensitive layer can be recorded without generating ablation during the exposure.

Examples 6–10, Comparative Example 2

The following photosensitive layer coating liquid (P-2) was prepared, coated on the aluminum substrate obtained in the way as described above by employing a wire bar, dried at 115° C. for 45 seconds in the hot wind mode drying device, and the planographic plate was obtained. An amount of coating after drying was in the range of 1.2–1.3 $g/m^2$.

| <Photosensitive layer coating liquid (P-2)> | |
|---|---|
| Alkali soluble resin | (compound indicated in Table 7, amount indicated in Table 7) |
| Dipentaerythritolhexaacrylate (B) | 1.00 g |
| Infrared rays absorbent agent "IR-6" (C) | 0.08 g |
| Iodonium salt "I-1" (D) | 0.30 g |
| Naphthalene sulfonic acid of Victoria Pure Blue | 0.04 g |
| Fluorinated surfactant (Megafac F-176, made by Dai Nippon Ink Chemical Industry, Co., Ltd.) | 0.01 g |
| Methylethylketone | 9.0 g |
| Methanol | 10.0 g |
| 1-methoxy-2-propanol | 8.0 g |

TABLE 7

| | Alkali soluble resin (content) | Plate life |
|---|---|---|
| Example 6 | Polyurethane resin 1 1.0 g | 55,000 sheets |
| Example 7 | Polyurethane resin 3 1.0 g | 52,000 sheets |
| Example 8 | Polyurethane resin 4 1.0 g | 55,000 sheets |
| Example 9 | Polyurethane resin 5 1.0 g | 55,000 sheets |
| Example 10 | Polyurethane resin 6 1.0 g | 51,000 sheets |
| Comparative Example 2 | Polymer (P-1) 1.0 g | 20,000 sheets |

[Exposure]

The obtained planographic original plate was exposed under the conditions of power 9 W, outer peripheral drum rotation count 210 rpm, plate face energy 100 $mJ/cm^2$, resolution 2400 dpi by Trendsetter 3244 VFS made by Creo, Co., Ltd., mounting water cooling type 40 W infrared semiconductor laser.

[Developing Treatment]

After the exposure, developing treatment was carried out by the automatic developer Stablon 900N made by Fuji Photography Film, Co., Ltd. As to the developing liquid, 1:1 aqueous dilution liquid of DN-3C made by Fuji Photograph Film, Co., Ltd. was employed as both of stocking liquid and replenishment liquid. The temperature of the developing bath was at 30° C. Moreover, 1:1 aqueous dilution liquid of FN-6 made by Fuji Photograph Film, Co., Ltd. was employed as a finisher.

[Evaluation of Plate Life]

Next, the printing was carried out by employing the printing machine Lislon made by Komori Corporation. At the moment, how many sheets could be printed while retaining sufficient ink concentration was measured by visual inspection and the plate life was evaluated. The results were all written in the aforementioned Table 7.

From the results of Table 7, it can be understood that the planographic plate of Example employing an image recording material of the present invention as a photosensitive layer, achieves excellent plate life compared to that of the Comparative Example 2 employing the known water insoluble and alkali soluble resin.

Examples 11–13

Except that the components of photosensitive layer coating liquid in the Example 1 was changed to the following components, similarly the planographic original plate was obtained, the printing plate was obtained by performing laser scanning exposure and developing treatment under the conditions similar to Example 1. The printing plate was printed in a similar manner, sensitivity, plate life and stain were evaluated. Moreover, after the obtained planographic original plates were conserved at 60° C. for 3 days, respectively, and stored at 45° C. at moisture 75% RH for 3 days, the printing similar to the aforementioned was carried out and the results were indicated in Table 8.

| <Photosensitive layer coating liquid (P-3)> | |
|---|---|
| Polyurethane resin (A) | (compound indicated in Table 8, amount indicated in Table 8) |
| Radical polymerizable compound (B) | (compound indicated in Table 8, amount indicated in Table 8) |
| Infrared rays absorbent agent "IR-6" (C) | 0.08 g |
| Iodonium salt "I-1" (D) | 0.30 g |
| Naphthalene sulfonic acid of Victoria Pure Blue | 0.04 g |
| Fluorinated surfactant (Megafac F-176, made by Dai Nippon Ink Chemical Industry, Co., Ltd.) | 0.01 g |
| Methylethylketone | 9.0 g |
| Methanol | 10.0 g |
| 1-methoxy-2-propanol | 8.0 g |

TABLE 8

| | Polyurethane resin (additive amount) | Radical polymerizable compound (additive amount) | Plate life/Stains of non-image portion | | |
|---|---|---|---|---|---|
| | | | Without Accelerated Storage | 60° C., 3 days | 45° C., 75%, 3 days |
| Example 11 | Polyurethane resin 1 1.0 g | B-2 1.0 g | 50,000 sheets Free of stain | 50,000 sheets | 50,000 sheets |
| Example 12 | Polyurethane resin 13 1.3 g | B-1 0.7 g | 53,000 sheets Free of stain | 53,000 sheets | 53,000 sheets |
| Example 13 | Polyurethane resin 1 1.3 g | B-1 0.7 g | 51,000 sheets Free of stain | 51,000 sheets | 51,000 sheets |

B-1

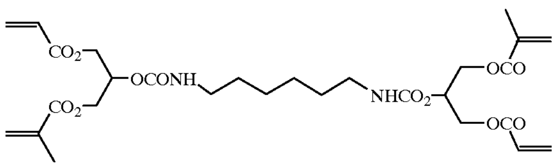

B-2

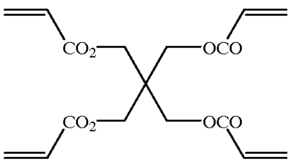

From Table 8, it can be understood that the planographic plate employing an image recording material of the present invention as a photosensitive layer is excellent in plate life without stain on the non-image portion and even after conservation at high temperature and under high moisture environment, the plate life and the stain resistance of non-image portion are not lowered, the storage stability of is excellent.

Examples 14–17, Comparative Example 3

[Preparation of Substrate]

After a 0.30 mm thick aluminum plate was grained with an aqueous suspension wave of 400 mesh pumice stone powder by a nylon brush, well rinsed with water. After aluminum plate was etched by immersing in a 10% by weight sodium hydroxide aqueous solution at 70° C. for 60 seconds and the plate was rinsed with running water, neutralized with a 20% by weight nitric acid aqueous solution, and then rinsed with water. Subsequently, an electrolytic surface roughening treatment was carried out by providing an anodic side electricity amount of 160 C/$dm^2$ at VA=12.7 V by alternating current having a sine waveform in a 1% by weight nitric acid aqueous solution. As the roughness of the surface is measured, it is 0.6 $\mu$m (expressed as Ra). Subsequently, after a de-smutting treatment was carried out by immersing the aluminum plate in a 30% by weight sulfuric acid aqueous solution at 55° C. for 2 minutes, the aluminum plate was submitted to an anodic oxidation process consisted of immersing the aluminum plate in a 20% by weight sulfuric acid solution for 2 minutes at a current density of 2 A/$dm^2$ so that the thickness of the anodic oxidation film was 2.7 g/$m^2$.

[Formation of Subbing Layer]

Next, the liquid components (i. e., sol liquid) were prepared according to the procedure of the following SG method.

| <Sol liquid components> | |
|---|---|
| Methanol | 130 g |
| Water | 20 g |
| 85% by weight phosphoric acid | 16 g |
| Tetraethoxysilane | 50 g |
| 3-methacryloxypropyltrimethoxysilane | 60 g |

The above described sol components were blended and stirred. Pyrogenic phenomenon was recognized in about 5 minutes. After the reaction is made for 60 minutes, the contents was transferred to other container, an amount of 3,000 g of methanol was added and thus a sol liquid was obtained.

The sol liquid was diluted with a methanol/ethylene glycol (9/1 in weight ratio) mixture and coated on the substrate so that the amount of Si adhered to the surface was 3 mg/$m^2$ and the coating layer was dried at 100° C. for 1 minute.

The photosensitive layer coating liquid (P-4) indicated below was coated on the aluminum substrate already under coated as described above by employing a wire bar, dried at 115° C. for 45 seconds in the hot wind mode drying device, and the planographic plate was obtained. An amount of coating after drying was in the range of 1.2–1.3 g/$m^2$.

| <Photosensitive layer coating liquid (P-4)> | |
|---|---|
| Polyurethane resin | (compound indicated in Table 9, amount indicated in Table 9) |
| Radical polymerizable compound (B) | (compound indicated in Table 9, amount indicated in Table 9) |
| Infrared rays absorbent agent "IR-1" (C) | 0.08 g |
| Iodonium salt "I-2" (D) | 0.30 g |
| Naphthalene sulfonate of Victoria Pure Blue | 0.04 g |
| Fluorinated surfactant (Megafac F-176, made by Dai Nippon Ink Chemical Industry, Co., Ltd.) | 0.01 g |
| Methylethylketone | 9.0 g |
| Methanol | 10.0 g |
| 1-methoxy-2-propanol | 8.0 g |

TABLE 9

| | Polyurethane resin (additive amount) | Radical polymerizable compound (additive amount) | Number of sheets of printing | Stain on Non-image portion |
|---|---|---|---|---|
| Example 14 | Polyurethane resin 4 1.2 g | DPHA 0.8 g | 80,000 sheets | Free of stain |
| Example 15 | Polyurethane resin 16 1.0 g | B-1 1.0 g | 85,000 sheets | Free of stain |
| Example 16 | Polyurethane resin 20 1.2 g | DPHA 0.8 g | 80,000 sheets | Free of stain |
| Example 17 | Polyurethane resin 27 1.0 g | B-1 1.0 g | 83,000 sheets | Free of stain |
| Comparative Example 3 | Polymer compound (P-2) 1.0 g | DPHA 1.0 g | 60,000 sheets | Stain |

IR-1

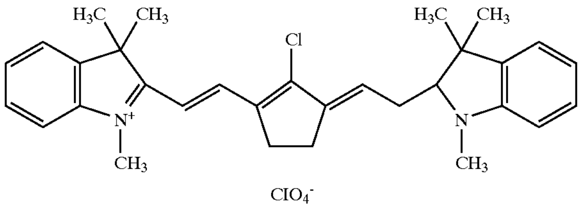

I-2

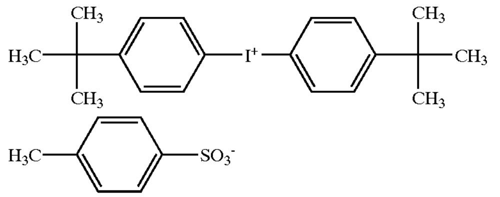

P-2: methylmethacrylate/methacrylic acid copolymer (mole ratio = 75/25, molecular weight 80,000) DPHA: dipentaerythritolhexaacrylate

[Exposure]

The obtained planographic original plate was exposed under the conditions of power 250 mW per one beam, outer peripheral drum rotation count 800 rpm, resolution 2400 dpi by Luxel T-9000CTP made by Fuji Photograph Films, Co., Ltd., mounting multichannel laser head.

[Developing Treatment]

After the exposure, developing treatment was carried out by the automatic developer Stablon 900N made by Fuji Photograph Films, Co., Ltd. As to the developing liquid, 1:8 aqueous dilution liquid of DP-4 made by Fuji Photograph Films, Co., Ltd. was employed as both of stocking liquid and replenishment liquid. The temperature of the developing bath was at 30° C. Moreover, 1:2 aqueous dilution liquid of GU-7 made by Fuji Photograph Films, Co., Ltd. was employed as a finisher.

[Evaluation of Plate Life and Stains]

Next, the printing was carried out by employing the printing machine Heidelburg SOR-KZ. At the moment, how many sheets could be printed while retaining sufficient ink concentration was measured and the plate life was evaluated. Moreover, on the obtained printed matter, the stains of non-image portion was evaluated by visual observation. The results are indicated in Table 9.

From the results of Table 9, it can be understood that the planographic plate employing an image recording material of the present invention as a photosensitive layer had Free of stain on the non-image portion and is excellent in plate life.

Examples 18–21

[Formation of Subbing Layer]

The following subbing liquid indicated below was coated on the aluminum substrate used in Examples 1–5 by a wire bar, dried at 90° C. for 30 seconds by employing the hot wind mode drying device. An amount of coating after drying was 10 $g/m^2$.

| [Subbing liquid] | |
|---|---|
| Copolymer of mole ratio of ethylmethacrylate and 2-acrylamide-2-methyl-1-propanesulfonate sodium salt being 75:15 | 0.1 g |
| 2-aminoethyl phosphonate | 0.1 g |
| Methanol | 50 g |
| Ion-exchanging water | 50 g |

On the aluminum plate thus treated, the photosensitive layer coating liquid (P-5) of the components indicated below was coated on the aluminum substrate already under coated as described above by employing a wire bar, dried at 115° C. for 45 seconds in the hot wind mode drying device, and the planographic plate was obtained. An amount of coating after drying was in the range of 1.2–1.3 $g/m^2$.

| <Photosensitive layer coating liquid (P-5)> | |
|---|---|
| Alkali soluble resin | (compound indicated in Table 10, amount indicated in Table 10) |
| Radical polymerizable compound (B) | (compound indicated in Table 10, amount indicated in Table 10) |
| Infrared rays absorbent agent "IR-1" (C) | 0.08 g |
| Iodonium salt "I-1" (D) | 0.30 g |
| Naphthalene sulfonate of Victoria Pure Blue | 0.04 g |
| Fluorinated surfactant | 0.01 g |
| (Megafac F-176, made by Dai Nippon Ink | |

-continued

| <Photosensitive layer coating liquid (P-5)> | |
|---|---|
| Chemical Industry, Co., Ltd.) | |
| Methylethylketone | 9.0 g |
| Methanol | 10.0 g |
| 1-methoxy-2-propanol | 8.0 g |

TABLE 10

| | Polyurethane resin (additive amount) | Radical polymerizable compound (additive amount) | Number of sheets of printing |
|---|---|---|---|
| Example 18 | Polyurethane resin 9 1.0 g | B-1 1.0 g | 78,000 sheets |
| Example 19 | Polyurethane resin 13 1.2 g | DPHA 0.8 g | 80,000 sheets |
| Example 20 | Polyurethane resin 19 1.2 g | B-1 0.8 g | 80,000 sheets |
| Example 21 | Polyurethane resin 25 1.1 g | DPHA 0.9 g | 78,000 sheets |

The obtained planographic original plate was exposed, development-treated and printed under the conditions similar to those of Examples 1–5 except 1:4 aqueous dilution liquid of CA-1 made by Fuji Photograph Films, Co., Ltd. as a developing solution and the evaluation of the plate life. The results are indicated in Table 10.

From Table 10, it was understood that the planographic plate employing an image recording material of the present invention as a photosensitive layer is excellent in plate life.

Examples 22–26

Next, a photosensitive layer is formed on the aluminum substrate similarly to Examples 6–10, further an aqueous solution of 3% by weight of polyvinylalcohol (degree of saponification 86.5–89 mole %, degree of polymerization 1000) was coated so that dried coating weight is 2 g/m$^2$, dried at 100° C. for 2 minutes, the planographic original plate which forms the protective layer on the photosensitive layer was obtained.

The obtained planographic original plate was exposed and development-treated under the conditions similar to those of Examples 6–10, and printed under the conditions similar to them, and the evaluation of plate life was carried out. The results are indicated in Table 11.

TABLE 11

| | Polyurethane resin (additive amount) | Number of sheets of printing |
|---|---|---|
| Example 22 | Polyurethane resin 1 1.0 g | 65,000 sheets |
| Example 23 | Polyurethane resin 3 1.0 g | 55,000 sheets |
| Example 24 | Polyurethane resin 4 1.0 g | 62,000 sheets |
| Example 25 | Polyurethane resin 5 1.0 g | 67,000 sheets |

TABLE 11-continued

| | Polyurethane resin (additive amount) | Number of sheets of printing |
|---|---|---|
| Example 26 | Polyurethane resin 6 1.0 g | 60,000 sheets |

From Table 11, it was understood that the planographic plate employing an image recording material of the present invention as a photosensitive layer is excellent in plate life and an enhanced effect of plate life is observed by forming the protective layer.

Further aspect of the present invention is explained in detail by the following examples. The present invention is not limited by these.

Examples 101 to 105

[Preparation of Substrates]

Molten alloy conforming to JIS A 1050 and containing 99.5% or more of aluminum, 0.30% of Fe, 0.10% of Si, 0.02% of Ti, and 0.013% of Cu was purified and cast. The purification treatment consisted of a degassing treatment to remove unnecessary gases such as hydrogen from the molten alloy and filtration by means of a ceramic tube filter. The casting was carried out according to a DC casting process. A layer having a thickness of 10 mm was scraped from the surface of the solidified block having a thickness of 500 mm and thereafter a homogenization treatment was carried out at 500° C. for 10 hours in order to prevent the intermetallic compounds from becoming coarse. Next, the alloy underwent hot rolling at 400° C. and intermediate annealing for 60 seconds in a continuous annealing furnace kept at 500° C. Further, the alloy underwent cold rolling and thus an aluminum rolled sheet having a thickness of 0.30 mm was produced. By controlling the surface roughness of the rolls, the center line average surface roughness Ra after cold rolling was controlled to 0.2 $\mu$m. After that, in order to improve the smoothness, the aluminum sheet was treated with a tension leveler.

Next, a surface treatment was carried out to prepare a planographic substrate.

First, in order to remove the rolling oil from the surface of the aluminum sheet, the aluminum sheet was immersed in a 10% sodium aluminate aqueous solution at 50° C. for 30 seconds as a degreasing treatment, neutralized by being immersed in a 30% sulfuric acid aqueous solution at 50° C. for 30 seconds, and thereafter desmutted.

Next, in order to improve the adhesion between the substrate and the recording layer and in order to provide water retention to the non-image portions, the substrate surface was subjected to a so-called graining process so that the substrate surface was roughened. The electrolytic graining was carried out by immersing the aluminum web in a solution containing 1% of nitric acid and 0.5% of aluminum nitrate and maintained at 45° C. and providing an anode side electricity amount of 240 C/dm$^2$ at a current density of 20 A/m$^2$ in an a. c. waveform having a duty ratio of 1:1 from an indirect feeding cell while the aluminum web was passed through the solution. After that, the aluminum web was immersed in a 10% sodium aluminate aqueous solution at 50° C. for 30 seconds as an etching treatment, neutralized by being immersed in a 30% sulfuric acid aqueous solution at 50° C. for 30 seconds, and thereafter desmutted.

Further, in order to improve wear resistance, chemical resistance, and water retention, oxidized film was formed on the substrate by an anodizing process. That is, the anodizing process was carried out by immersing the aluminum web in a 20% sulfuric acid aqueous solution as an electrolyte solution and maintained at 35° C. and carrying out the electrolysis by a direct current at a current density of 14 $A/m^2$ fed from an indirect feeding cell while the aluminum web was passed through the solution. In this way, an oxidized film at 2.5 $g/m^2$ was formed.

After that, in order to secure the hydrophilicity as the non-image portions of the printing plate, a silicate treatment was carried out. That is, the aluminum web was immersed in a 1.5% No. 3 sodium silicate aqueous solution maintained at 70° C. while the aluminum web was passed through the solution in such a manner that the duration of the contact between the aluminum web and the solution was 15 seconds. After the treatment, the aluminum web was rinsed with water. The amount of Si adhered to the surface was 10 $mg/m^2$. Ra (center line average surface roughness) of the substrate prepared in the above-described way was 0.25 μm.

First, examples of the synthesis of (A) specific polymers soluble in alkaline water are explained.

Synthesis Example 101

A 500 mL, three-neck flask fitted with a condenser and a stirrer was charged with 165 mL of N,N-dimethylformamide and heated to 70° C. Then, under a nitrogen stream, 10.2 g of the exemplary monomer M2, 83 g of allyl methacrylate (expressed as AllylMA in Table 12), and 0.435 g of "V-65" (manufactured by Wako Pure Chemical Industries, Ltd.) dissolved in 165 mL of N,N-dimethylformamide were added dropwise over a period of 2 and half hours. The reaction solution was stirred at 70° C. for 2 hours. After the completion of the reaction, the reaction solution was poured into 3 L of water so that the polymer deposited. The polymer was collected by filtration and thereafter dried. In this way, a specific polymer (polymer N.1) soluble in alkaline water was obtained. The weight average molecular weight was measured by gel permeation chromatography (GPC) using a polystyrene standard and was found to be 95,000.

Synthesis Examples 102 to 121

Polymers 2 to 21 listed in Table 12 were synthesized in the same way as in Synthesis Example 101, except that the kinds and proportions of the monomers to be charged into the flask were changed according to Table 12. The weight average molecular weights of these specific polymers soluble in alkaline water were measured in the same way as in Synthesis Example 101. The results are shown in Table 12.

The monomers in Table 12 are denoted by the following abbreviations.

AllylMA: allyl methacrylate
AEMA: 2-allyloxyethyl methacrylate
AllylA: allyl acrylate
AEA: 2-allyloxyethyl acrylate
MAA: methacrylic acid
BzMA: benzyl methacrylate
AA: acrylic acid

TABLE 12

| Polymers | Monomer Compositions (Mol % of Monomers Charged) | | | Weight Average Molecular Weights |
|---|---|---|---|---|
| N.1 | M2<br>17 | AllylMA<br>83 | | 95,000 |
| N.2 | M2<br>18 | AEMA<br>82 | | 110,000 |
| N.3 | M3<br>18 | AEMA<br>82 | | 100,000 |
| N.4 | M5<br>15 | AllylMA<br>85 | | 98,000 |
| N.5 | M9<br>15 | AllylA<br>85 | | 90,000 |
| N.6 | M9<br>13 | M39<br>20 | AEA<br>67 | 110,000 |
| N.7 | M9<br>11 | M36<br>20 | AEA<br>69 | 113,000 |
| N.8 | M23<br>42 | AllylMA<br>42 | MAA<br>16 | 98,000 |
| N.9 | M26<br>40 | AEMA<br>40 | MAA<br>20 | 105,000 |
| N.10 | M6<br>18 | AllylMA<br>82 | | 112,000 |
| N.11 | M1<br>20 | BzMA<br>80 | | 132,000 |
| N.12 | M3<br>17 | M46<br>83 | | 153,000 |
| N.13 | M1<br>20 | M23<br>30 | AllylMA<br>50 | 144,000 |
| N.14 | M10<br>18 | M37<br>32 | BzMA<br>50 | 98,000 |
| N.15 | M2<br>20 | M46<br>40 | AEMA<br>40 | 124,000 |
| N.16 | M1<br>8 | AEMA<br>84 | MAA<br>8 | 103,000 |
| N.17 | M10<br>6 | AEA<br>88 | AA<br>6 | 122,000 |
| N.18 | M11<br>18 | M46<br>52 | AllylMA<br>30 | 131,000 |
| N.19 | M14<br>19 | M26<br>21 | AEMA<br>60 | 101,000 |
| N.20 | M1<br>10 | M31<br>10 | AEMA<br>80 | 129,000 |
| N.21 | M1<br>8 | M3<br>8 | AEA<br>84 | 133,000 |

[Formation of Image Recording Layers]

The following coating liquid [P-A] was prepared. The coating liquid was coated using a wired bar on the aluminum substrate obtained in the above-described manner, and the coating was dried at 115° C. for 45 seconds in a hot air convection-type oven. In this way, planographic original plates were obtained. The preparations of these planographic original plates were designated as Examples 101 to 105, respectively. After drying, the coating weights were within the range of 1.2 to 1.3 $g/m^2$.

| <Coating liquid [P-A]> | |
|---|---|
| Specific polymer soluble in alkaline water (compound shown in Table 13) | 1.00 g |
| Dipentaerythritol hexaacrylate | 1.00 g |
| Light-to-heat converting agent "IR-6" (having the following structure) | 0.08 g |
| Iodonium salt "I-1" (having the following structure) | 0.30 g |
| Victoria Pure Blue naphthalenesulfonate | 0.04 g |
| Fluorine-containing surfactant (Megafac F-176, manufactured by Dainippon Ink and Chemicals Inc.) | 0.01 g |
| Methyl ethyl ketone | 9.0 g |
| Methanol | 10.0 g |
| 1-methoxy-2-propanol | 8.0 g |

TABLE 13

| | Polymer Soluble in Alkaline Water | Number of Prints |
|---|---|---|
| Example 101 | N.1 | 50,000 Sheets |
| Example 102 | N.3 | 52,000 Sheets |
| Example 103 | N.6 | 55,000 Sheets |
| Example 104 | N.10 | 52,000 Sheets |
| Example 105 | N.17 | 51,000 Sheets |
| Comparative Example 101 | P-1 | 20,000 Sheets |

IR-6

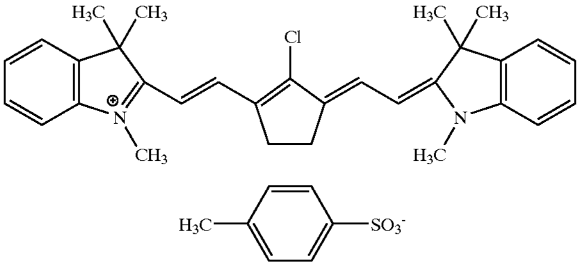

I-1

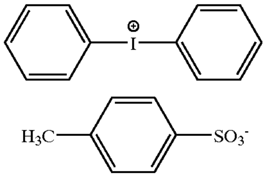

Comparitive Example 101

A planographic original plate was obtained in the same way as in Example 101, except that 1.0 g of a benzyl methacrylate/methacrylic acid copolymer (having a monomer ratio of 80/20 and a molecular weight of 100,000 and listed as P-1 in Table 13) was added in place of the specific polymer soluble in alkaline water in the formulation of the coating liquid [P-A]. This example was designated as Comparative Example 101.

The planographic original plates thus obtained underwent exposure by means of Trendsetter 3244VFS manufactured by Creo Corp. mounted with a water-cooled 40 W infrared semiconductor laser. The exposure conditions were as follows. Output power was 9W, revolution of exterior drum was 210 rpm, energy on plate surface was 100 mJ/$cm^2$, and resolution was 2400 dpi.

[Development Processing]

After the exposure, the exposed plates were developed using Stabron 900N manufactured by Fuji Photo Film Co., Ltd. As to the developing solutions, a 1:1 water-diluted solution of DN-3C manufactured by Fuji Photo Film Co., Ltd. was used as the initially charged solution and also as the replenisher solution. The temperature of the developing bath was 30° C. The finisher was a 1:1 water-diluted solution of FN-6 manufactured by Fuji Photo Film Co., Ltd.

[Printing]

Next, printing was carried out using Lithron manufactured by Komori Corporation Ltd. In the printing operation, the maximum number of printed sheets that held sufficient ink density was visually inspected. The assessment results are shown in Table 13.

As can be seen from the results shown in Table 13, the planographic original plates of the examples using the specific polymers soluble in alkaline water of the present invention each had a better plate life in comparison with the planographic original plate of Comparative Example 101 using Polymer P-1 that did not have a group represented by the general formula (39) or the general formula (40) as the binder polymer.

Examples 106 to 108

Planographic original plates were obtained in the same way as in Examples 101 to 105 and Comparative Example 101, except that the coating liquid [P-A] was replaced with a coating liquid having the following composition. These planographic original plates were then stored under an accelerated condition. After that printing plates were obtained by laser-scanning exposure in the same way. Prints were produced using the printing plates in the same way, and sensitivity, plate life, and stain resistance were assessed. The results are shown in Table 14. The structures of compounds B-1 and B-2 that were used as radical-polymerizable compounds are shown below.

| <Coating liquid [P-B]> | |
|---|---|
| Specific polymer soluble in alkaline water (compound shown in Table 14) | (in an amount shown in Table 14) |
| Radical-polymerizable compound (compound shown in Table 14) | (in an amount shown in Table 14) |
| Light-to-heat converting agent "IR-6" | 0.08 g |
| Iodonium salt "I-1" | 0.30 g |
| Victoria Pure Blue naphthalenesulfonate | 0.04 g |
| Fluorine-containing surfactant (Megafac F-176, manufactured by Dainippon Ink and Chemicals Inc.) | 0.01 g |
| Methyl ethyl ketone | 9.0 g |
| Methanol | 10.0 g |
| 1-methoxy-2-propanol | 8.0 g |

TABLE 14

| | | | Number of Prints/Stains in Non-Image Portions | | |
|---|---|---|---|---|---|
| | Polymer Compound | Polymerizable Compound | Without Accelerated Storage | 60° C., 3 Days | 45° C., 75% Relative Humidity, 3 Days |
| Example 106 | 2 1.0 g | B-1 1.0 g | 50,000 Sheets Free of Stain | 50,000 Sheets Free of Stain | 50,000 Sheets Free of Stain |
| Example 107 | 7 1.3 g | B-1 0.7 g | 53,000 Sheets Free of Stain | 53,000 Sheets Free of Stain | 53,000 Sheets Free of Stain |
| Example | 20 1.3 g | B-2 0.7 g | 51,000 Sheets | 51,000 Sheets | 51,000 Sheets |

TABLE 14-continued

| | | | Number of Prints/Stains in Non-Image Portions | | |
|---|---|---|---|---|---|
| | Polymer Compound | Polymerizable Compound | Without Accelerated Storage | 60° C., 3 Days | 45° C., 75% Relative Humidity, 3 Days |
| 108 | | | Free of Stain | Free of Stain | Free of Stain |

| <Sol composition> | |
|---|---|
| Methanol | 130 g |
| Water | 20 g |
| 85% by weight phosphoric acid | 16 g |
| Tetraethoxysilane | 50 g |
| 3-methacryloxypropyltrimethoxysilane | 60 g |

The above-listed compounds were blended and stirred. In about 5 minutes, heat generation was observed. After the compounds were caused to react for 60 minutes, the contents

B-1

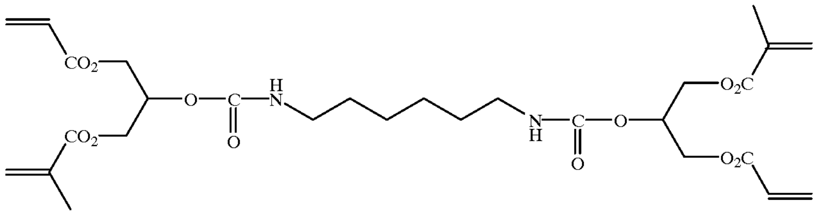

B-2

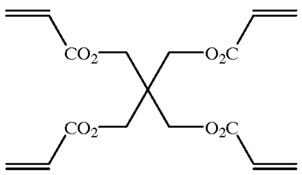

As can be seen from the results of Table 14, the planographic original plates of Examples 106 to 108 obtained by changing the combination of the polymer soluble in alkaline water and the radical-polymerizable compound also had excellent plate life and were found to have excellent storage stability on standing like the planographic original plates of Examples 101 to 105 because stain formation and reduction in plate life after storage were not observed.

Examples 109 to 112

[Preparation of Substrates]

A 0.30 mm thick aluminum plate was grained on its surface with a nylon brush using an aqueous suspension of 400 mesh pumice stone powder. After being well rinsed with water, the aluminum plate was etched by immersing in a 10% by weight sodium hydroxide aqueous solution at 70° C. for 60 seconds. After that, the plate was rinsed with flowing water, neutralized with a 20% by weight nitric acid aqueous solution, and rinsed with water. Next, an electrolytic surface-roughening treatment was carried out by providing an anode side electricity amount of 160 C/dm$^2$ at $V_A$=12.7 V using an alternating current having a sine waveform in a 1% by weight nitric acid aqueous solution. The surface roughness was found to be 0.6 μm (expressed as Ra). Next, a desmutting treatment was carried out by immersing the aluminum plate in a 30% by weight sulfuric acid aqueous solution at 55° C. for 2 minutes. After that, the aluminum plate was subjected to an anodizing process comprising immersing the aluminum plate in a 20% by weight sulfuric acid solution at 55° C. for 2 minutes at a current density of 2 A g/dm$^2$ so that the thickness of the anodized film became 2.7 g/m$^2$.

Next, a liquid composition (i.e., a sol) was prepared according to the following SG process.

were transferred to other container and 3000 g of methanol was added. In this way, a sol was obtained.

The sol was diluted with a methanol/ethylene glycol (9/1 in weight ratio) mixture and coated on a substrate in such a manner that the amount of Si adhered to the surface was 3 mg/m$^2$. The coating layer was dried at 100° C. for 1 minute.

[Formation of Image Recording Layers]

The following coating liquid [P-C] for image recording material with the composition described below was coated using a wired bar on the subbed aluminum substrate described above, and the coating was dried at 115° C. for 45 seconds in a hot air convection-type oven. In this way, image recording layers were formed and planographic original plates were obtained. The preparations of these planographic original plates were designated as Examples 109 to 112, respectively. After drying, the coating weights were within the range of 1.2 to 1.3 g/m$^2$. The radical-polymerizable compound B-1 was the same as the one used in Example 106. Dipentaerythritol hexaacrylate was abbreviated as DPHA in Table 15.

| <Coating liquid [P-C]> | |
|---|---|
| Specific polymer soluble in alkaline water (compound shown in Table 15) | (in an amount shown in Table 15) |
| Radical-polymerizable compound (compound shown in Table 15) | (in an amount shown in Table 15) |
| Light-to-heat converting agent "IR-1" (having the following structure) | 0.08 g |
| Iodonium salt "I-2" (having the following structure) | 0.30 g |
| Victoria Pure Blue naphthalenesulfonate | 0.04 g |

-continued

| <Coating liquid [P-C]> | |
|---|---|
| Fluorine-containing surfactant (Megafac F-176, manufactured by Dainippon Ink and Chemicals Inc.) | 0.01 g |
| Methyl ethyl ketone | 9.0 g |
| Methanol | 10.0 g |
| 1-methoxy-2-propanol | 8.0 g |

IR-1

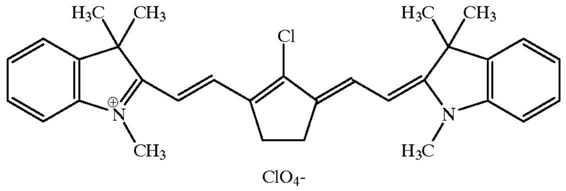

I-2

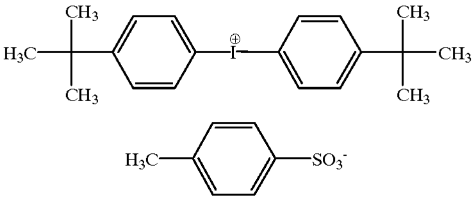

TABLE 15

| | Polymeric Compound | Polymerizable Compound | Number of Prints | Stains in Non-Image Portions |
|---|---|---|---|---|
| Example 109 | 3<br>1.2 g | DPHA<br>0.8 g | 80,000<br>Sheets | Free of Stain |
| Example 110 | 5<br>1.0 g | B-1<br>1.0 g | 85,000<br>Sheets | Free of Stain |
| Example 111 | 13<br>1.2 g | DPHA<br>0.8 g | 80,000<br>Sheets | Free of Stain |
| Example 112 | 15<br>1.0 g | B-1<br>1.0 g | 83,000<br>Sheets | Free of Stain |
| Comparative Example 102 | P-2<br>1.0 g | DPHA<br>1.0 g | 60,000<br>Sheets | With Stain |

Comparative Example 102

A planographic original plate was obtained in the same way as in Example 109, except that 1.0 g of a methyl methacrylate/methacrylic acid copolymer (having a monomer ratio of 75/25 and a molecular weight of 80,000 and listed as P-2 in Table 15) was added in place of the specific polymer soluble in alkaline water in the formulation of the coating liquid [P-C]. This example was designated as Comparative Example 102.

[Exposure]

The planographic original plates thus obtained underwent exposure by means of Luxel T-9000CTP manufactured by Fuji Photo Film Co., Ltd. mounted with a multi-channel laser head. The exposure conditions were as follows. Output power per beam was 250 mW, revolution of exterior drum was 800 rpm, and resolution was 2400 dpi.

[Development Processing]

After the exposure, the exposed plates were developed using Stabron 900N manufactured by Fuji Photo Film Co., Ltd. As to the developing solutions, a 1:8 water-diluted solution of DP-4 manufactured by Fuji Photo Film Co., Ltd.

was used as the initially charged solution and also as the replenisher solution. The temperature of the developing bath was 30° C. The finisher was a 1:2 water-diluted solution of GU-7 manufactured by Fuji Photo Film Co., Ltd.

[Printing]

Next, printing was carried out using a Heidelberg SOR-KZ printing machine. In the printing operation, the maximum number of printed sheets that held sufficient ink density for printing was visually inspected. At the same time, the stain resistance in the non-image portions was assessed by visually inspecting the stains in the non-image portions of the prints obtained as well as evaluating plate life. The assessment results are shown in Table 15.

As can be seen from the results shown in Table 15, the planographic original plates of the examples using the specific polymers soluble in alkaline water of the present invention each had a better plate life and did not produce stains in non-image portions in comparison with the planographic original plate of Comparative Example 102 using Polymer P-2 that did not have a group represented by the general formula (39) or the general formula (40) as the binder polymer.

Examples 113 to 116

The following coating liquid for subbing layer was coated using a wired bar on the aluminum substrate used in Examples 101 to 105, and the coating was dried at 90° C. for 30 seconds in a hot air convection-type oven. After drying, the coating weight was 10 mg/m$^2$.

| [Coating liquid for subbing layer] | |
|---|---|
| Ethyl acrylate/sodium salt of 2-acrylamide-2-methyl-1-porpanesulfonic acid (75:15 in molar ratio) copolymer | 0.1 g |
| 2-aminoethyl sulfonic acid | 0.1 g |
| Methanol | 50 g |
| Ion-exchange water | 50 g |

The following coating liquid [P-D] with the composition described below was coated using a wired bar on the aluminum substrate subbed as described above, and the coating was dried at 115° C. for 45 seconds in a hot air convection-type oven. In this way, image recording layers were formed and planographic original plates were obtained. The preparations of these planographic original plates were designated as Examples 113 to 116, respectively. After drying, the coating weights were within the range of 1.2 to 1.3 g/m$^2$.

| <Coating liquid [P-D]> | |
|---|---|
| Specific polymer soluble in alkaline water (compound shown in Table 16) | (in an amount shown in Table 16) |
| Radical-polymerizable compound (compound shown in Table 16) | (in an amount shown in Table 16) |
| Light-to-heat converting agent "IR-1" | 0.08 g |
| Iodonium salt "I-1" | 0.30 g |
| Victoria Pure Blue naphthalenesulfonate | 0.04 g |
| Fluorine-containing surfactant (Megafac F-176, manufactured by Dainippon Ink and Chemicals Inc.) | 0.01 g |
| Methyl ethyl ketone | 9.0 g |
| Methanol | 10.0 g |
| 1-methoxy-2-propanol | 8.0 g |

The planographic original plates thus obtained underwent exposure, development, and printing steps in the same way as in Examples 101 to 105, except that a 1:4 water-diluted solution of CA-1 manufactured by Fuji Photo Film Co., Ltd. was used as the developing solution. After that, the assessment of plate life was carried out in the same way as in Example 101. The results are shown in Table 16.

TABLE 16

| | Polymeric Compound | Polymerizable Compound | Number of Prints |
|---|---|---|---|
| Example 113 | 16<br>1.0 g | B-1<br>1.0 g | 78,000 Sheets |
| Example 114 | 18<br>1.2 g | DPHA<br>0.8 g | 80,000 Sheets |
| Example 115 | 12<br>1.2 g | B-1<br>0.8 g | 80,000 Sheets |
| Example 116 | 15<br>1.1 g | DPHA<br>0.9 g | 78,000 Sheets |

As can be seen from the results of Table 16, the planographic original plates of Examples 113 to 116 obtained by changing the combination of the polymer soluble in alkaline water and the radical-polymerizable compound also had excellent plate life like the planographic original plates of Examples 109 to 112.

According to the present invention, a negative-type image recording material which is capable of directly being engraved from digital data of a computer or the like by recording with a solid state laser and a semiconductor laser irradiating infrared rays and is capable of achieving the excellent plate life without any ablation in the case where the material is used for a photosensitive layer for the planographic original plate.

What is claimed is:

1. A heat mode corresponding negative-type image recording material, containing (A) a polymeric compound having a group elected from the group consisting of the following general formulae (44), (47), (48), (49), (50), (51) and (52) on a side chain and being insoluble in water and soluble in an aqueous alkaline solution, (B) a radical-polymerizable compound, (C) a light-to-heat converting agent, and (D) a compound which is capable of image-recording by heat mode exposure to light of a wavelength which can be absorbed by (C) the light-to-heat converting agent, wherein image recording can be performed by heat mode exposure:

$$—O—CO—NH—R^4 \qquad (44)$$

$$—SO_2—NH—R^7 \qquad (47)$$

$$—CO—NH—SO_2—R^8 \qquad (48)$$

$$—SO_2—NH—CO—R^9 \qquad (49)$$

$$—NH—CO—NH—SO_2—R^{10} \qquad (50)$$

$$—SO_2—NH—CO—NH—R^{11} \qquad (51)$$

$$—CO—NH—SO_2—NH—R^{12} \qquad (52)$$

wherein, $R^7$, $R^{11}$ and $R^{12}$ represent a hydrogen, an alkyl group, a cycloalkyl group, an aryl group or an aralkyl group having 1–12 carbon atoms which may have a substituent, $R^4$, $R^8$, $R^9$ and $R^{10}$ represent an alkyl group, a cycloalkyl group, an aryl group or aralkyl group having 1–12 carbon atoms which may have a substituent.

2. The heat mode corresponding negative-type image recording material according to claim 1, wherein said (A) polymeric compound has a carboxyl group.

3. The heat mode corresponding negative-type image recording material according to claim 1, wherein said (D) compound which is capable of image-recording by a heat mode exposure of a light of wavelength which can be absorbed by (C) a light-to-heat converting agent is an onium compound.

4. A heat mode corresponding negative-type image recording material, containing (A) a polymeric compound having a group represented by the following general formula (41) and a carboxyl group on a side chain and being insoluble in water and soluble in an aqueous alkaline solution, (B) a radical-polymerizable compound, (C) a light-to-heat converting agent, and (D) a compound which is capable of image-recording by heat mode exposure light of wavelength which can be absorbed by (C) the light-to-heat converting agent, wherein image recording can be performed by a heat mode exposure:

$$—CONH—R^1 \qquad (41)$$

wherein, $R^1$ represents a hydrogen, an alkyl group, a cycloalkyl group, a aryl group or an aralkyl group having 1–12 carbon atoms which may have a substituent.

5. A method for image recording comprising exposing to infrared radiation a negative-type image recording material that comprises (A) a polyurethane resin insoluble in water and soluble in an aqueous alkaline solution, (B) a radical-polymerizable compound, (C) a light-to-heat converting agent having an absorbing peak at a wavelength of 760 nm to 1,200 nm and (D) a compound which is capable of image-recording by being exposed to light of a wavelength which can be absorbed by (C) the light-to-heat converting agent.

6. The method for image recording according to claim 5, wherein said (A) a polyurethane resin insoluble in water and soluble in an aqueous alkaline solution is polyurethane resin whose fundamental skeleton is formed by a structure unit represented by reaction product generated between at least one species of diisocyanate compounds represented by the following general formula (3) and at least one species of diol compounds represented by the following general formula (4):

$$OCN—X°—NCO \qquad (3)$$

$$OH—Y°—OH \qquad (4)$$

wherein X° and Y° represent bivalent organic residues.

7. The method for image recording according to claim 6, wherein diisocyanate compound represented by said general formula (3) is represented by the general formula (5):

$$OCN\text{-}L^1\text{-}NCO \qquad (5)$$

wherein $L^1$ represents bivalent aliphatic or aromatic hydrocarbon group which may have a substituent.

8. The method for image recording according to claim 6, wherein diol compound represented by said general formula (4) is selected from the group consisting of a polyester compound, a polyesterdiol compound, a polycarbonate diol compound, and a diol compound containing a carboxyl group.

9. The method for image recording according to claim 5, wherein said (A) polyurethane resin insoluble in water and soluble in an aqueous alkaline solution contains an aromatic group on principal chain and/or side chain.

10. The method for image recording according to claim 9, wherein content of said aromatic group is 10–80% by weight in said (A) polyurethane resin insoluble in water and soluble in an aqueous alkaline solution.

11. The method for image recording according to claim 5, wherein said (A) polyurethane resin insoluble in water and soluble in an aqueous alkaline solution contains 0.4 meq/g or more of carboxyl group.

12. The method for image recording according to claim 5, wherein weight average molecular weight of said (A) polyurethane resin insoluble in water and soluble in an aqueous alkaline solution is 1,000 or more.

13. The method for image recording according to claim 5, wherein said (A) polyurethane resin insoluble in water and soluble in an aqueous alkaline solution contains at least one carboxyl group on a side chain.

14. The method for image recording according to claim 5, wherein said (D) compound which is capable of image-recording by heat mode exposure to light of wavelength which can be absorbed by (C) the light-to-heat converting agent is an onium compound.

15. The method for image recording according to claim 5, wherein said light-to-heat converting agent is represented by the following general formula (58):

General formula (58)

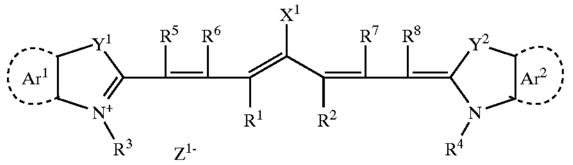

wherein $X^1$ represents a halogen atom or $X^2$-$L^1$, in which $X^2$ represent an oxygen atom or a sulfur atom, and $L^1$ represents a hydrocarbon group having 1–12 carbon atoms; $R^1$ and $R^2$ each independently represent a hydrocarbon group having 1–12 carbon atoms, bind each other, and form a five-membered ring or a six-membered ring; $Ar^1$ and $Ar^2$ each independently represent an aromatic hydrocarbon group; $Y^1$ and $Y^2$ each independently represent a sulfur atom or a dialkylmethylene group having 12 or less carbon atoms; $R^3$ and $R^4$ each independently represent a hydrocarbon group having 20 or less carbon atoms; $R^5$, $R^6$, $R^7$ and $R^8$ each independently represent a hydrogen atom or a hydrocarbon group having 12 or less carbon atoms; and $Z^{1-}$ represents a counter anion.

* * * * *